(12) United States Patent
Baltussen et al.

(10) Patent No.: US 8,690,005 B2
(45) Date of Patent: Apr. 8, 2014

(54) CHARGED PARTICLE LITHOGRAPHY APPARATUS AND METHOD OF GENERATING VACUUM IN A VACUUM CHAMBER

(75) Inventors: Sander Baltussen, Breda (NL); Guido De Boer, Leerdam (NL); Tijs Frans Teepen, Tilburg (NL); Hugo Martijn Makkink, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 380 days.

(21) Appl. No.: 12/708,545

(22) Filed: Feb. 19, 2010

(65) Prior Publication Data

US 2010/0270299 A1    Oct. 28, 2010

Related U.S. Application Data

(60) Provisional application No. 61/154,415, filed on Feb. 22, 2009, provisional application No. 61/289,407, filed on Dec. 23, 2009.

(51) Int. Cl.
*B65D 6/00*         (2006.01)
*B65D 8/04*         (2006.01)

(52) U.S. Cl.
USPC ........... 220/692; 220/681; 220/682; 220/683; 220/693

(58) Field of Classification Search
USPC ................ 220/4.33, 681, 682, 683, 692, 693
See application file for complete search history.

(56) References Cited

U.S. PATENT DOCUMENTS

| | | |
|---|---|---|
| 3,365,091 A | 1/1968 | Skiaky |
| 5,853,176 A | 12/1998 | Kiriyama |
| 2004/0187781 A1 | 9/2004 | Takahashi |
| 2005/0183824 A1 | 8/2005 | Lee et al. |
| 2005/0183827 A1 | 8/2005 | White et al. |
| 2007/0257033 A1 * | 11/2007 | Yamada ...................... 220/4.33 |

FOREIGN PATENT DOCUMENTS

| | | |
|---|---|---|
| EP | 1808889 A2 | 7/2007 |
| JP | 02122824 A | 5/1990 |
| JP | 2005329303 A | 12/2005 |
| JP | 2008129358 A | 6/2008 |
| WO | 0175354 A1 | 10/2001 |

* cited by examiner

*Primary Examiner* — Anthony Stashick
*Assistant Examiner* — Madison L Poos
(74) *Attorney, Agent, or Firm* — Hoyng Monegier LLP; David P. Owen; Coraline J. Haitjema

(57) ABSTRACT

A vacuum chamber comprising a plurality of wall panels enclosing an interior space, in which the wall panels are removably attached to form the chamber using a plurality of connection members for locating the wall panels in a predetermined arrangement. The vacuum chamber further comprises one or more sealing members provided at the edges of the wall panels. The wall panels are arranged so that a vacuum tight seal is formed at the edges of the wall panels as a result of forming a vacuum in the interior space.

51 Claims, 25 Drawing Sheets

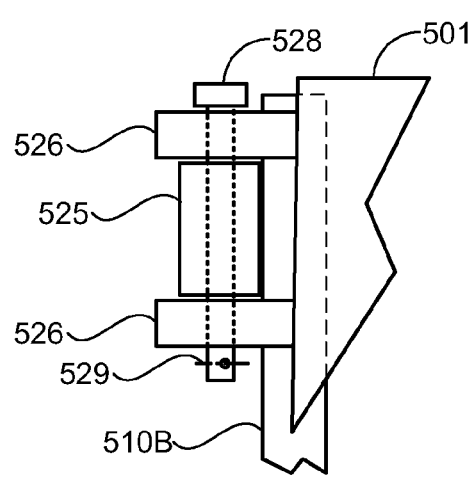
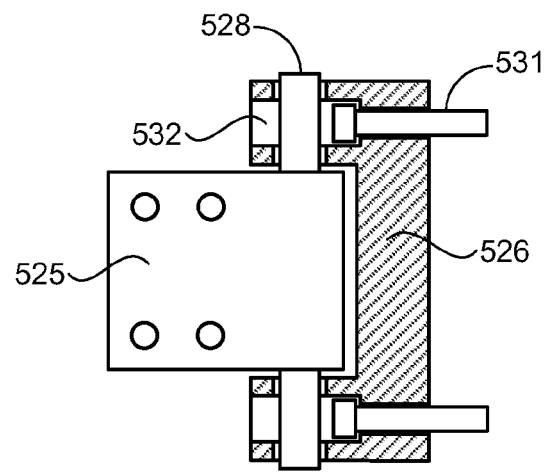
FIG. 11A        FIG. 11B
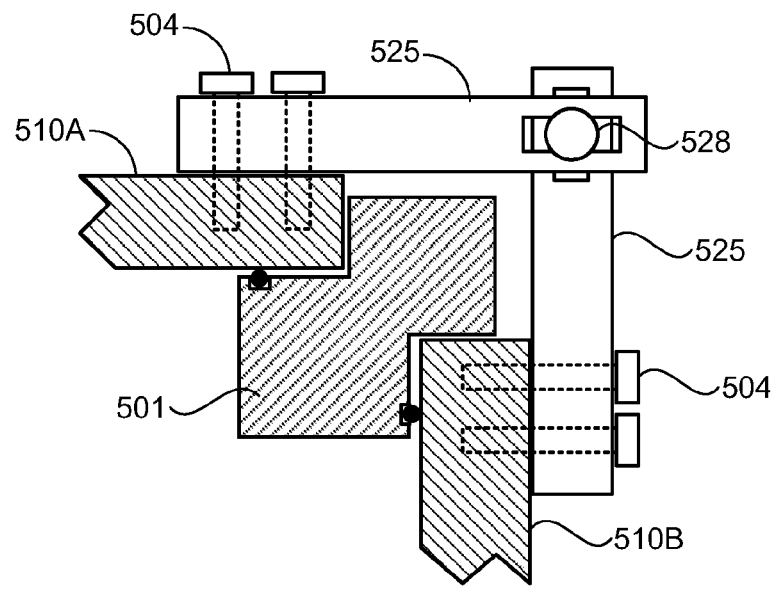
FIG. 12

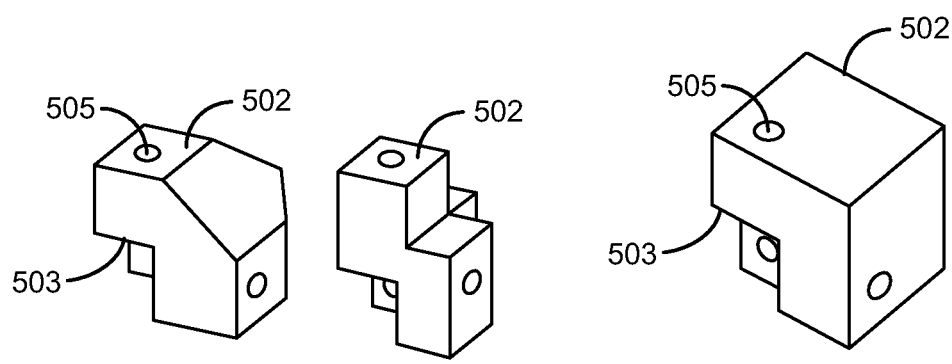
FIG. 14E
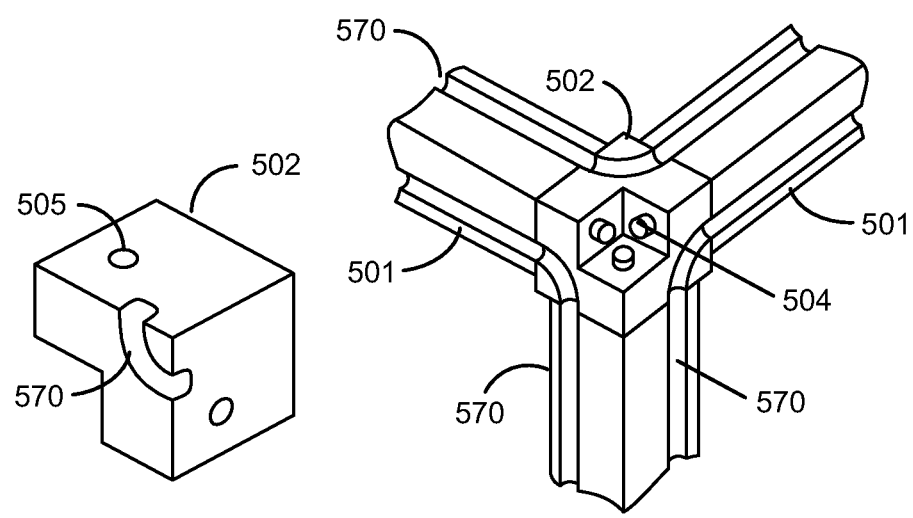
FIG. 14F  FIG. 14G

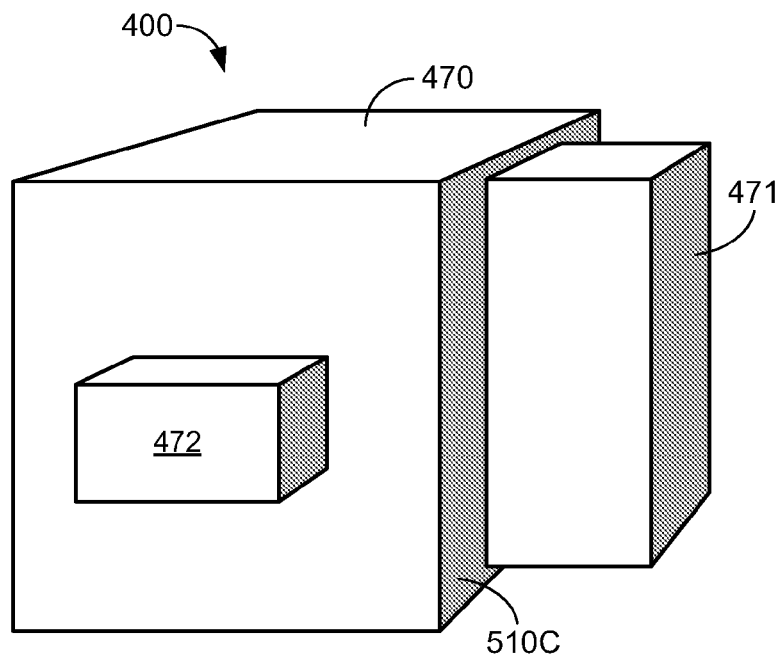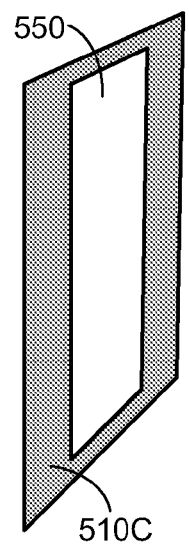
FIG. 15A
FIG. 15B
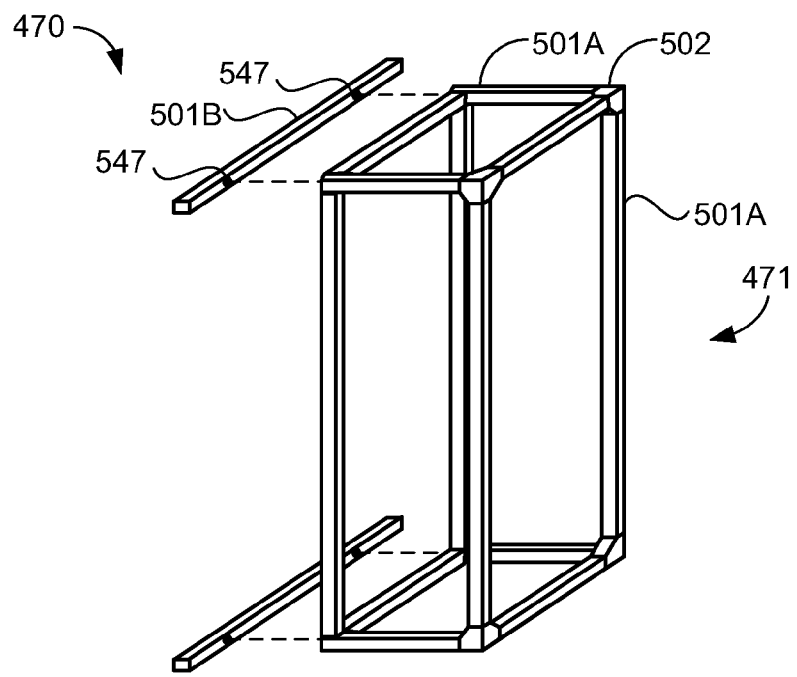
FIG. 15C

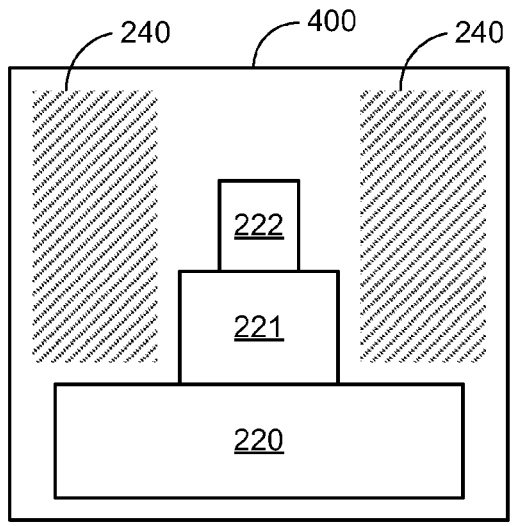
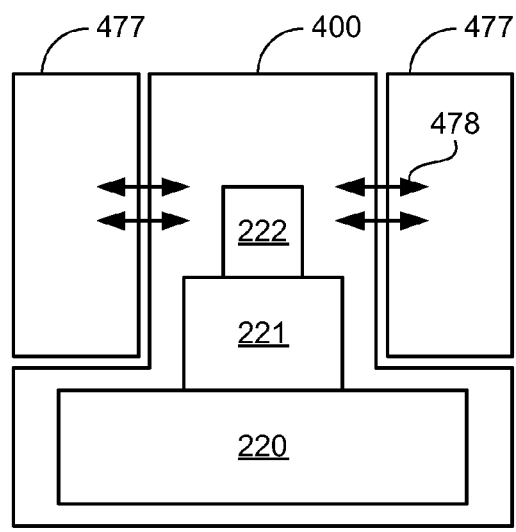
FIG. 17A    FIG. 17B
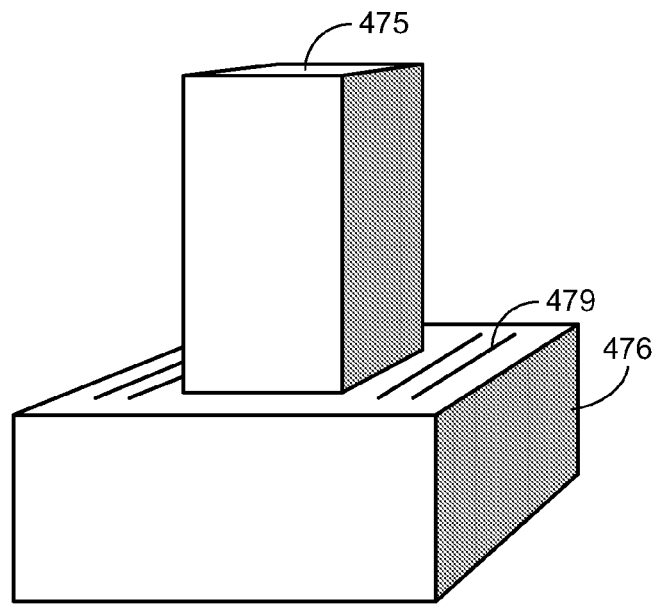
FIG. 17C

CHARGED PARTICLE LITHOGRAPHY APPARATUS AND METHOD OF GENERATING VACUUM IN A VACUUM CHAMBER

BACKGROUND OF THE INVENTION

1. Field of the Invention

The present invention relates to a charged particle lithography apparatus, a vacuum chamber and a method of generating a vacuum in a vacuum chamber, for application in, for example, a lithography or inspection system.

2. Description of the Related Art

Charged particle and optical lithography machines and inspection machines are typically operated in a vacuum environment. This requires a vacuum chamber large enough to house the lithography machine or group of machines. The vacuum chamber must be sufficiently strong and vacuum tight to support the required vacuum, while having openings for electrical, optical and power cabling to enter the chamber, for the wafer or target to be loaded into the chamber, and to permit access to machine for maintenance and operational needs. Where charged particle machines are involved, the vacuum chamber must also provide shielding to prevent external electromagnetic fields from interfering with the operation of the machine.

Prior vacuum chamber designs have suffered from various drawbacks such as excessive weight relative to throughput of the lithography machine, excessive use of floor space, small size of the door, and poor electromagnetic shielding around the openings. Prior designs have required a costly and time-consuming fabrication process in the factory, usually requiring full assembly of the chamber before shipping to the site where it will be used, and high transport costs from the factory to the site where they are used.

BRIEF SUMMARY OF THE INVENTION

The present invention aims to provide an improved vacuum chamber addressing the shortcomings of prior designs. According to one aspect of the invention, a vacuum chamber comprises a plurality of wall panels enclosing an interior space. The wall panels are assembled to form the chamber using a plurality of connection members, the connection members locating the wall panels in a predetermined arrangement. The vacuum chamber further comprises one or more sealing members provided at the edges of the wall panels, and the wall panels are arranged so that a vacuum tight seal is formed at the edges of the wall panels as a result of forming a vacuum in the interior space.

The connection members may be adapted to removably connect the wall panels and also enable disassembly. The connection members are preferably adapted to locate the wall panels while providing for a small predetermined range of movement of the wall panels. The connection members may be adapted to locate the wall panels while permitting the wall panels to move and seal more tightly against the sealing members when the vacuum is formed in the interior space. The connection members may be designed to locate the wall panels without providing the vacuum tight seal at the edges of the wall panels, and may be designed to locate the wall panels in a position providing a near vacuum tight seal at the edges of the wall panels, and/or to guide the wall panels towards a position providing the vacuum tight seal at the edges of the wall panels.

The vacuum tight seal at the edges of the wall panels may be realized by operation of a suction device connected to the interior space, the suction device having an air displacement capacity sufficiently larger than a flow rate of air into the interior space via the near vacuum tight seal to generate the vacuum in the interior space.

The vacuum chamber may be constructed with a full supporting frame with wall panels attached to the frame to enclose the interior space, or with full supporting wall panels and no frame or frame only for support during the initial assembly, or a hybrid form of these designs. The vacuum chamber with full supporting frame comprises a frame with wall panels attached to and supported by the frame, the wall panels sealing against the frame to provide a vacuum tight seal. The vacuum chamber with full supporting wall panels comprises walls panels which interlock and seal against each other at their edges to form a vacuum tight structure. The frame may be completely omitted, or a frame sufficient for providing support for the walls during assembly may be used. The hybrid form comprises a frame providing some support and wall panels providing some support, the wall panels sealing against the frame and the wall panels also interfacing with each other and sealing against each other.

All of these designs may use a highly modular design that permits a short manufacturing lead time, for example four weeks of less. The frame may be constructed from separate frame members and corner components and assembled in-situ, and the wall panels may be manufactured as separate units for assembly in-situ. This design permits the separate components to be manufactured in higher volumes in standardized sizes, reducing manufacturing costs. It also enables the vacuum chamber to be shipped disassembled as a "flat pack" kit set, reducing the cost of transport from the factory to the site where the chamber will be used. The vacuum chamber may be designed for enclosing small volumes. A suitable size for some applications, e.g. a charged particle lithography machine, an interior space of 1 m×1 m×1 m may be suitable. The vacuum chamber is preferably able to maintain a pressure of at least $10^{-3}$ mbar, and preferably $10^{-6}$ mbar.

The vacuum chamber may include wall to wall connections. The wall panels are preferably removably attached to each other using connection members. One or more of the wall panels may comprise interlocking regions for interlocking with one or more of the other wall panels, for inhibiting movement of the wall panels under the influence of the vacuum formed in the interior space. A vacuum tight seal is preferably formed between the wall panels by a force exerted on the wall panels when the vacuum is formed in the interior space of the chamber.

The wall panels may also have stepped edges to provide for interlocking between the wall panels. Two of the wall panels may have stepped edges forming an interlocking arrangement in which a force exerted against an outside surface of a first wall panel results in the first wall panel sealing more tightly against the stepped edge of a second wall panel, and a force exerted against an outside surface of the second wall panel results in the second wall panel sealing more tightly against the stepped edge of the first wall panel. An adhesive may be applied between opposing stepped edges of the wall panels, and connection members may be used to locate the wall panels. The connection members may penetrate only a portion of the thickness of the wall panels, and they may comprise pins or bolts. A strip member may be interposed between beveled edges of two of the wall panels, the beveled edge of each wall panel forming a seal against the opposing surface of the strip member. An O-ring may be disposed between the beveled edge of each wall panel and the opposing surface of the strip member, and a connection member may be used for connecting the wall panels and strip member. An adhesive may be used between the beveled edge of each wall panel and the opposing surface of the strip member.

For vacuum chamber designs incorporating a frame, the wall panels may be removably attached to the frame using connection members, and one or more sealing members may be provided between the wall panels and the frame for forming the vacuum tight seal between the wall panels and the frame. The frame may include interlocking regions for interlocking with one or more of the wall panels, for inhibiting movement of the wall panels or frame under the influence of the vacuum formed in the interior space. The wall panels and frame are preferably arranged so that, when a vacuum is formed in the interior space, the wall panels and the frame members are interlocked more tightly to increase the rigidity of the vacuum chamber and/or to create a vacuum tight seal.

The frame of the vacuum chamber may comprise a plurality of interconnected frame members, the frame members connected by connecting members. One or more of the frame members may comprise one or more recesses in an end region for interlocking with an end region of another frame member. At least one of the frame members may have a cross-sectional profile with a cut-out portion for accommodating an edge of one of the wall panels. At least one of the frame members may have a cross-sectional profile with two cut-out portions, a first cut-out portion for accommodating an edge of a first wall panel and a second cut-out portion for accommodating an edge of a second wall panel.

A frame member may form an interlocking arrangement with the first and second wall panels in which a force exerted against an outside surface of the first wall panel results in the first wall panel sealing more tightly against the first cut-out portion of the frame member and the second cut-out portion of the frame member pushing against an end of the second wall panel. The frame member and the wall panels may form an interlocking arrangement in which the lower pressure in the vacuum chamber results in a first force exerted against an outside surface of a first wall panel acting in a direction to push the first wall panel more tightly against a first one of the cut-out portions of the frame member, and a second force exerted against an outside surface of a second wall panel acting in a direction to push the second wall panel more tightly against a second one of the cut-out portions of the frame member.

The frame members may comprise recesses or holes for receiving fastening members for connection of additional frame members, and the recesses or holes in the frame members may be pre-drilled and plugged before assembly of the vacuum chamber, with a bolt or pin extending into the recess or hole from the inside of the chamber. The recesses or holes may be pre-drilled in standardized positions along one or more of the frame members.

The vacuum chamber may include a frame with a plurality of interconnected frame members and a plurality of corner components at corners of the frame, the corner components connecting the frame members. A sealing member may be used for sealing a connection between the frame members and the corner components, and the connection members may be used for the connection between the frame members and the corner components. The connection members may be used for the connection between the frame members and the wall panels, and the connection members comprise pins or bolts, or a latch or a hinge.

The sealing members used for the vacuum chamber may include a sealing member between the wall panels and the frame members, with the wall panels arranged so that the wall panels are pushed more tightly against the sealing member when a vacuum is formed in the interior space of the vacuum chamber. A strip member may be provided between the wall panels, and the wall panels arranged so that the wall panels are pushed more tightly against the strip member when a vacuum is formed in the interior space of the vacuum chamber.

One or more of the sealing members may be disposed between adjacent wall panels, and may comprise an O-ring or C-ring, or copper or indium, or they may comprise a sealing agent comprised of at least one of vacuum grease, polytetrafluroethylene, or glue.

The vacuum chamber may comprises a frame and one or more of the wall panels glued to the frame. The sealing members may comprise a single flexible piece of sealing material adapted for sealing a gap at a plurality of edges of one or more wall panels, and the single flexible piece of sealing material may comprise twelve elongated portions adapted for sealing a gap at a plurality of edges of six wall panels. The wall panels may have a groove for partially accommodating the one or more sealing members, and if the vacuum chamber comprises a frame, the frame may have a groove for partially accommodating the one or more sealing members.

The vacuum chamber may have at least one of the wall panels connected to the frame via a hinge arrangement, the hinge arrangement being provided with play in the hinges to allow the wall panel to move inwards and provide a vacuum tight seal against the frame. At least one of the wall panels may be connected to the frame via a hinge arrangement, wherein the hinged wall panel comprises a door forming one entire wall of the chamber. The vacuum chamber may comprise a frame and at least one of the wall panels may be connected to the frame via a hinge arrangement at all sides of the wall panel, and at least one of the wall panels may include additional strengthening members which interlock with the frame. The additional strengthening members may interlock with the frame at points located between the corners of the frame.

The vacuum chamber preferably includes wall panels that may be removed to function as access doors. The wall panels are preferably sufficiently light so that one or two persons can handle the wall panels without requiring heavy lifting equipment, so that access to the equipment inside the chamber is improved. The wall panels of the vacuum chamber may comprise aluminum, and at least one face of the wall panels of the chamber may be substantially covered with a mu metal. The wall panels may comprise a composite structure including one or more layers of mu metal, and the composite structure may include a layer of aluminum and a layer of mu metal. The layer of aluminum may be separated from the layer of mu metal by a plurality of layers. The wall panels may comprise a composite structure including a layer with an open structure, such as honeycomb layer. One or more electrically insulating layers may be used for insulating the mu metal layers. Parts protruding into the chamber may be covered by a bellows structure comprised of or covering one or more layers of mu metal, and the bellows structure may be coupled to the one or more layers of mu metal.

The contours of the vacuum chamber may vary to conform to the contours of equipment to be installed in the chamber, and the vacuum chamber may comprise a narrower upper portion and wider lower portion forming a single vacuum enclosure. One or more ports may be provided for admitting electrical, optical, and/or power cables or wires into the chamber, the ports providing a seal around the cables or wires. The ports may be arranged on one or more side walls of the upper portion of the chamber for admitting cables or wires from equipment arranged around the upper portion and above the lower portion.

Each port may admit cables or wires for a single module of a lithography machine disposed in the vacuum chamber. At least one of the ports may comprise a lid and one or more mu metal caps, and the port lid and the one or more mu metal caps may be arranged as a unit. The port lid, one or more mu metal caps, the electrical, optical, and/or power cables or wires passing through the port, and a connector terminating the cables or wires, may be arranged to be removed and replaced as a unit. The mu metal caps may be arranged to press against corresponding mu metal wall layers when the port lid is closed. One or more vacuum pump openings may be provided in the chamber, the openings having a flap or valve comprising mu metal.

In another aspect, the invention comprises a kit set of components for assembly into a vacuum chamber, the kit set comprising a plurality of wall panels, a plurality of connection members adapted for removably attaching to the wall panels to locate the wall panels in a predetermined arrangement enclosing an interior space, and one or more sealing members adapted for forming a vacuum tight seal at the edges of the wall panels. Wall panels and connection members may be adapted to form a vacuum tight seal at the edges of the wall panels when the kit set is assembled and a vacuum is formed in the interior space, and the connection members may be adapted to locate the wall panels while providing for a small predetermined range of movement of the wall panels when the kit set is assembled. The connection members may be adapted to locate the wall panels when the kit set is assembled while permitting the wall panels to move and seal more tightly against the sealing members when a vacuum is formed in the interior space, and the connection members may be adapted to guide the wall panels towards a position providing a vacuum tight seal at the edges of the wall panels when the kit set is assembled. The connection members may be adapted to locate the wall panels in a position providing a near vacuum tight seal at the edges of the wall panels when the kit set is assembled.

A further aspect of the invention comprises a wall panel for use in a modular vacuum chamber, the wall panel comprising a stepped edge for interlocking with a second wall panel or a frame member, the stepped edge comprising a groove or recess for accommodating a sealing member adapted for forming a vacuum tight seal between the wall panel and the second wall panel or frame member, the wall panel further comprising holes or recesses for accommodating a plurality of connection members adapted for removably attaching to the wall panel to the second wall panel or frame member. The wall panel may be square or rectangular with a stepped edge formed at all four edges of the wall panel for interlocking with four other wall panels or frame members, wherein the groove or recess and sealing member extends around all four edges of the wall panel for forming a vacuum tight seal between the wall panel and the four other wall panels or frame members, and wherein the holes or recesses for accommodating the connection members are located at positions on all four edges of the wall panel for removably attaching to the wall panel to the four other wall panels or frame members.

In yet another aspect, the invention comprises a method of constructing a vacuum chamber, the method comprising positioning a plurality of wall panels to enclose an interior space, locating the wall panels in position using a plurality of connection members to form a near vacuum tight seal around the edges of the wall panels, and removing gas from the interior space of the vacuum chamber at a rate greater than a leakage rate of gas into the interior space, so that the pressure in the interior space is reduced sufficiently to exert an inwards directed force on the wall panels to create a vacuum tight seal around the edges of the wall panels.

BRIEF DESCRIPTION OF THE DRAWINGS

Various aspects of the invention will be further explained with reference to embodiments shown in the drawings wherein:

FIGS. 11A and 11B are detail views of alternative embodiments of a hinge arrangement;

FIG. 12 is a cross section view of a connection between wall panels of a vacuum chamber;

FIG. 14E is a detail view of alternative embodiments of a corner component;

FIGS. 14F-14G are detail views of frame members with an o-ring channel;

FIG. 15A is a perspective view of a vacuum chamber with a main portion and additional portions;

FIG. 15B is a perspective view of a wall panel of the vacuum chamber of FIG. 15A;

FIG. 15C is an exploded view of frame members of the vacuum chamber of FIG. 15A;

FIG. 17A is a cross-sectional view of a vacuum chamber housing a lithography machine;

FIG. 17B is a cross-sectional view of a vacuum chamber constructed to reduce the unused space in the vacuum chamber;

FIG. 17C is a perspective view of the vacuum chamber of FIG. 17B;

DESCRIPTION OF ILLUSTRATIVE EMBODIMENTS

The following is a description of various embodiments of the invention, given by way of example only and with reference to the drawings.

Charged Particle Lithography System

Figure 1:
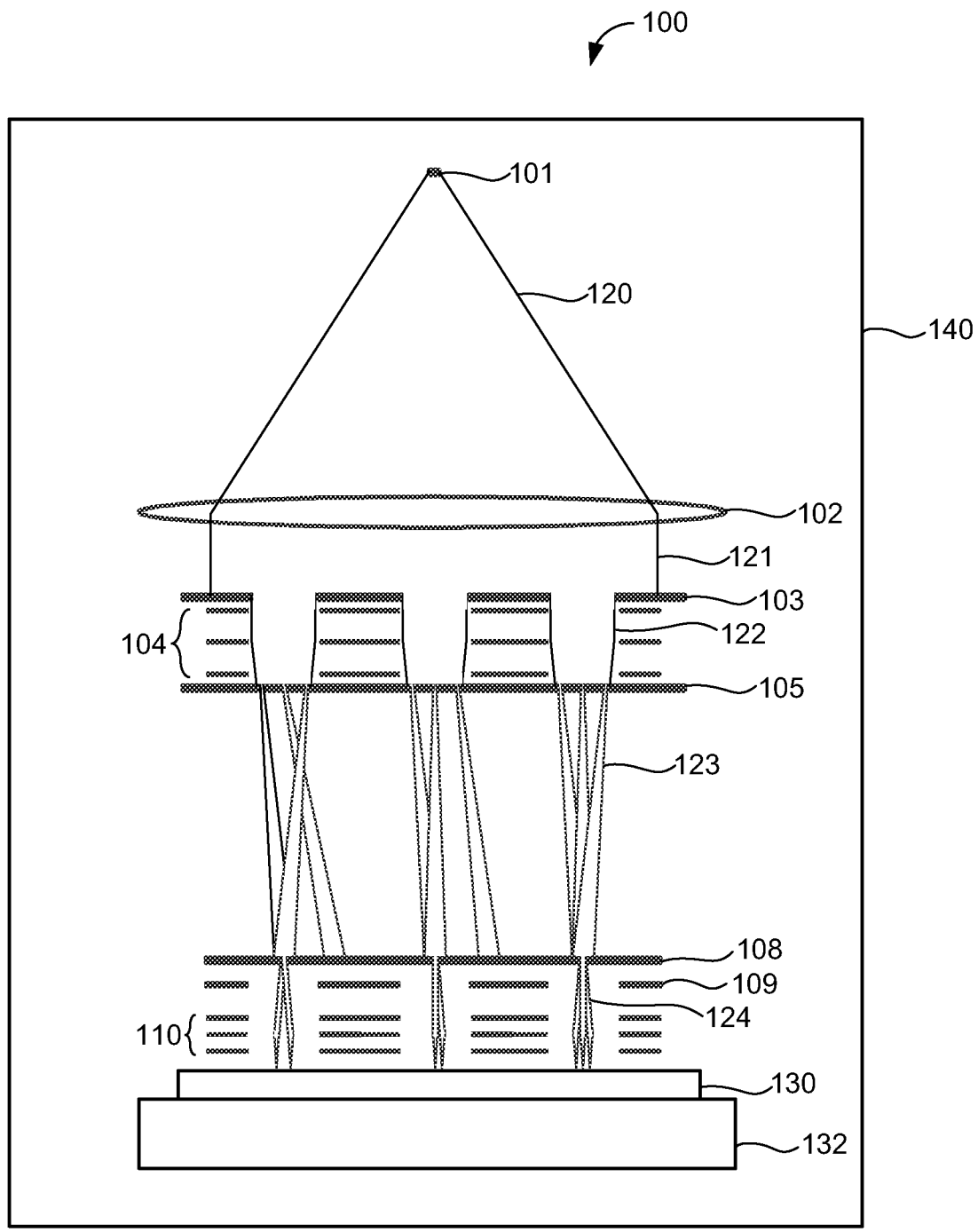
FIG. 1 is a simplified schematic drawing of an embodiment of a charged particle lithography system.

FIG. 1 shows a simplified schematic drawing of an embodiment of a charged particle lithography system 100. Such lithography systems are described for example in U.S. Pat. Nos. 6,897,458 and 6,958,804 and 7,019,908 and 7,084,414 and 7,129,502, U.S. patent application publication no. 2007/0064213, and co-pending U.S. patent application Ser. Nos. 61/031,573 and 61/031,594 and 61/045,243 and 61/055,839 and 61/058,596 and 61/101,682, which are all assigned to the owner of the present invention and are all hereby incorporated by reference in their entirety. In the embodiment shown in FIG. 1, the lithography system comprises a charged particle source 101, e.g. an electron source for producing an expanding electron beam 120. The expanding electron beam 120 is collimated by collimator lens system 102. The collimated electron beam 121 impinges on a first aperture array 103, which blocks part of the beam to create a plurality of electron sub-beams 122.

The sub-beams 122 pass through a condenser lens array 104 which focuses the sub-beams in the plane of a beam stop array 108. The focused sub-beams 122 impinge upon a second aperture array 105, which blocks part of the sub-beams to create a group of beamlets 123 from each sub-beam 122. The system generates a large number of beamlets 123, preferably about 10,000 to 1,000,000 or more beamlets.

The second aperture array 105 also comprises a beamlet blanker array 105a, comprising a plurality of blankers for individually deflecting one or more of the electron beamlets. The deflected and undeflected electron beamlets 123 arrive at beam stop array 108, which has a plurality of apertures. The beamlet blanker array 105a and beam stop array 108 operate together to block or let pass the beamlets 123. If beamlet blanker array 105a deflects a beamlet, it will not pass through the corresponding aperture in beam stop array 108, but instead will be blocked. But if beamlet blanker array 105a does not deflect a beamlet, then it will pass through the corresponding aperture in beam stop array 108, and through beam deflector array 109 and projection lens arrays 110.

Beam deflector array 109 provides for deflection of each beamlet 124 in the X and/or Y direction, substantially perpendicular to the direction of the undeflected beamlets, to scan the beamlets across the surface of target 130. Next, the beamlets 124 pass through projection lens arrays 110 and are projected onto target 130. The projection lens arrangement preferably provides a demagnification of about 100 to 500 times. The beamlets 124 impinge on the surface of target 130 positioned on moveable stage 132 for carrying the target. For lithography applications, the target usually comprises a wafer provided with a charged-particle sensitive layer or resist layer.

The charged particle lithography system operates in a vacuum environment. A vacuum is desired to remove particles which may be ionized by the charged particle beams. Such particles may be attracted to the source, may dissociate and deposit onto the machine components, and may disperse the charged particle beams. A vacuum of at least $10^{-3}$ mbar is typically required for a charged particle lithography machine. In order to maintain the vacuum environment, the charged particle lithography system is located in a vacuum chamber 140. All of the major elements of the lithography system are preferably housed in a common vacuum chamber, including the charged particle source, beamlet apertures and blanking system, projector system for projecting the beamlets onto the wafer, and the moveable wafer stage. In another embodiment the charged particle source may be housed in a separate vacuum chamber.

Modular Lithography System

Figure 2:
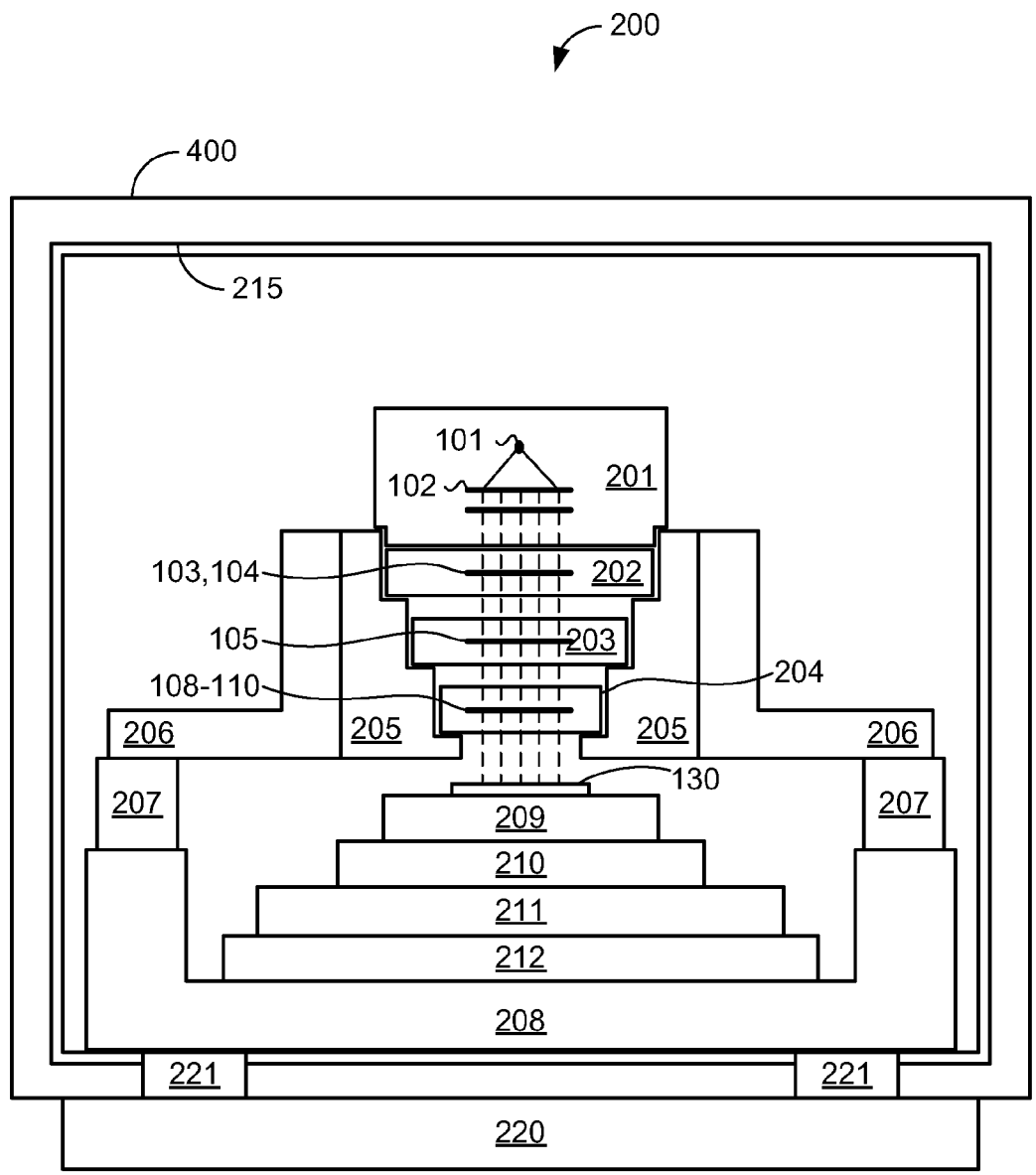
FIG. 2 is a simplified block diagram of a modular lithography system.

FIG. 2 shows a simplified block diagram illustrating the principal elements of a modular lithography system 200. The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 2, these modular subsystems include an illumination optics module 201 including the charged particle beam source 101 and collimator lens system 102, an aperture array and condenser lens module 202 including aperture array 103 and condenser lens array 104, a beam switching module 203 including a beamlet blanker array 105a, and projection optics module 204 including beam stop array 108, beam deflector array 109, and projection lens arrays 110. The modules are designed to slide in and out from an alignment frame. In the embodiment shown in FIG. 3, the alignment frame comprises an alignment inner subframe 205 and an alignment outer subframe 206. A frame 208 supports the alignment subframes 205 and 206 via vibration damping mounts 207. A target 130, e.g. a wafer, rests on wafer table 209, which is in turn mounted on chuck 210. Chuck 210 sits on the stage short stroke 211 and long stroke 212. The lithography machine is enclosed in vacuum chamber 400, which includes a mu metal shielding layer or layers 215. The machine rests on base plate 220 supported by frame members 221.

Each module requires a large number of electrical signals and/or optical signals, and electrical power for its operation. The modules inside the vacuum chamber receive these signals from control systems which are typically located outside of the chamber. The vacuum chamber includes openings, referred to as ports, for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules.

Cluster of Lithography Machines

Figure 3A:
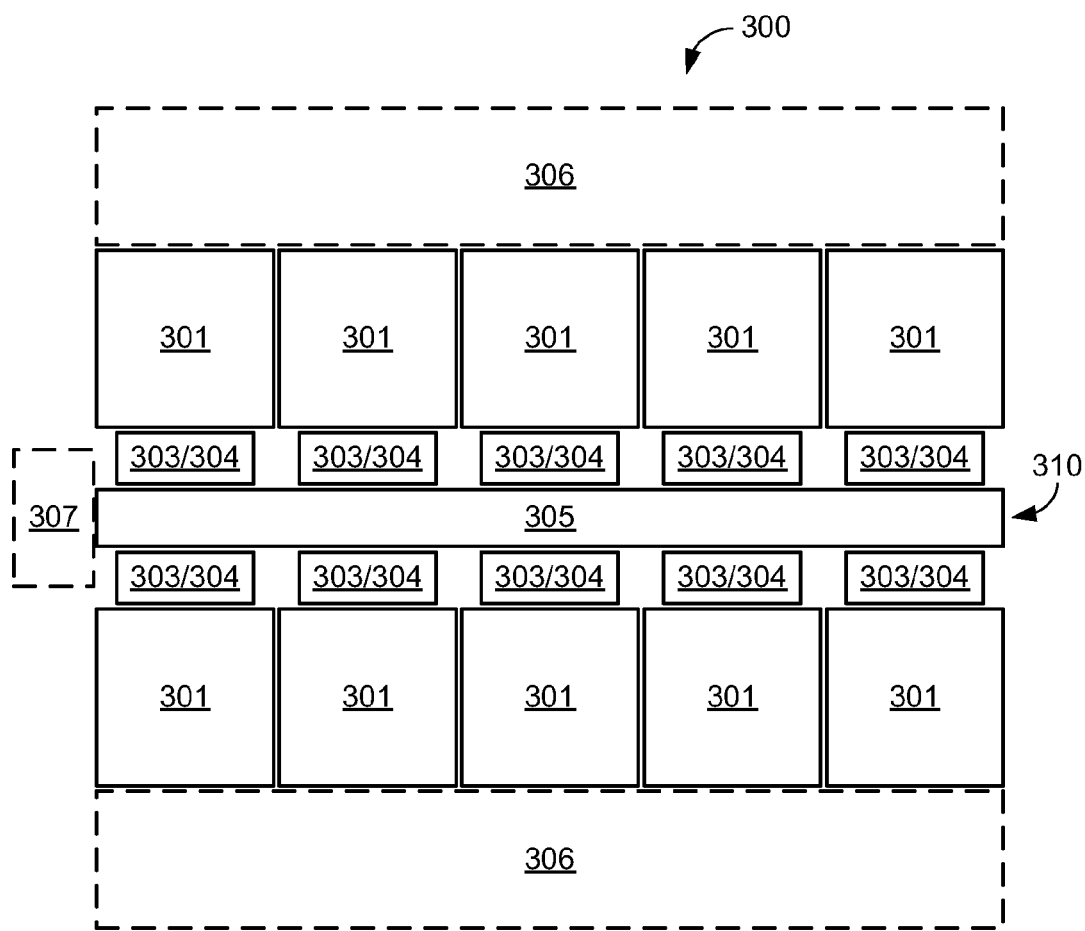
FIGS. 3A and 3B is an example of an arrangement of lithography machines and wafer loading system.

FIG. 3A shows an example of a layout of a group of lithography machines 300 cooperating with a common wafer loading system. In this example, ten lithography machines 301 are arranged in two rows of five to form a single cluster of machines, although a smaller or larger number of machines may be included in a cluster. Each lithography system is contained in its own vacuum chamber, with the front of each chamber facing a central aisle 310 and the rear of each chamber facing an access corridor 306.

The central aisle accommodates a conveying robot 305 for conveying wafers to and from each lithography machine 301, a wafer load unit 303 for each machine 301 for loading and unloading wafers into and out of the machine, and a stage actuator 304 for each machine for moving the machine's wafer stage inside its vacuum chamber.

The common conveying robot 305 may comprise more than one robot unit, each robot unit being configured to perform functions assigned to the common robot 305. If a robot unit malfunctions, another robot unit may take over its function, which minimizes the downtime of the cluster due to robot failure. The malfunctioning robot unit may be removed from the cluster and transferred to a robot storage unit 307, where it can be serviced without disturbing the operation of the cluster.

Each vacuum chamber includes a wafer loading opening in its front wall for receiving a wafer. The load lock (and the robot) is preferably disposed at about the height of the wafer stage of the lithography machine, i.e. more or less at half the height of the vacuum chamber. Although the load lock or wafer load unit 303 and the stage actuator 304 are shown side-by-side in FIG. 3A, these are preferably arranged with the load lock or wafer load unit 303 above the stage actuator 304 as shown in the arrangement in FIG. 3B. Each vacuum chamber also includes a door in its back wall for permitting access to the lithography machine for maintenance, repair, and operational adjustment.

Each lithography machine is preferably disposed in its own vacuum chamber. All of the major elements of the charged particle lithography system are preferably housed in a common vacuum chamber, including the charged particle source [??], projector system for projecting the beamlets onto the wafer, and the moveable wafer stage. Various embodiments of a vacuum chamber 400 for housing a charged particle lithography system are described in detail below. The wafer handling robot and stage actuator for each machine may also be located in the same vacuum chamber with the lithography machine, or they may be located in separate vacuum chambers. The stage actuator will typically include electric motors, such as linear electric motors, which are preferably separated from the lithography machine by magnetic field shielding. This may be accomplished by providing one or more mu metal layers on the walls of the vacuum chamber housing the lithography machine, and locating the stage actuator in a separate chamber.

Floor space within a fab is valuable, due to the high cost to construct and operate fabs and the increase in cost as the size of the fab is increased. Efficient use of the fab floor space is thus important, and the lithography machines are preferably designed to consume as little floor space as possible and fit together with other machines as efficiently as possible.

The vacuum chamber preferably has a substantially square footprint (i.e. the floor of the chamber is square or approximately square). This enables an efficient arrangement for housing the lithography machine, typically designed for exposing a circular wafer, and producing an efficient arrangement of multiple lithography machines as shown, for example, in FIG. 3A. Furthermore, the chamber may have a box-like shape, preferably limited in height to allow further decrease of fab space required. In some embodiments the chamber is shaped substantially cubically (i.e. the height of the chamber is approximately the same as its width and depth).

Figure 3B:
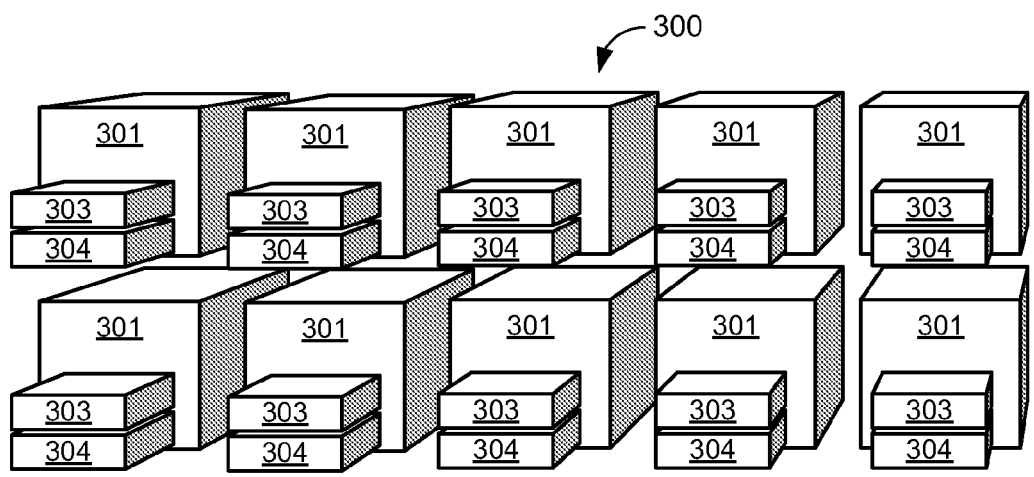

In an alternative arrangement, the vacuum chambers are stacked vertically as well as or in addition to being arranged side-by-side. FIG. 3B shows a perspective view of one row of vacuum chambers in such an arrangement. Two, three, or possibly more layers of vacuum chambers may be used, for example creating an arrangement of 20 chambers (for two layers) or 30 chambers (for three layers) in the same floor space as shown in FIG. 3A. Multiple chambers may utilize a common vacuum pumping system, and a common conveying robot system. Alternatively, a common vacuum pumping system and a common conveying robot system may be utilized for each layer of chambers, or for each row of chambers.

Modular Vacuum Chamber

In conventional designs, the chamber 400 is constructed by welding the walls together at their edges. However, welding the walls can be slow and expensive, for example due to the difficulties in making a precision vacuum tight weld without deforming the vacuum chamber walls. Furthermore, this usually requires that the vacuum chamber is fully assembled in the factory before shipping to its final destination, increasing the size of the shipped item and increasing the cost of shipping. This becomes even more significant when the chamber is to be sent by air (which may be preferred to avoid corrosion and other problems caused by sea transport).

In some embodiments the vacuum chamber 400 may comprise a frame with walls fixed or hinged to the frame. In this way, the vacuum chamber can be constructed as a kitset that can be shipped in a disassembled flat pack configuration and assembled on site or at a location nearer its final location. The components of the vacuum chamber may be assembled without welding, and the chamber constructed so that when the chamber is pumped down, the force of the vacuum within the chamber assists in forming a vacuum-tight construction by exerting force that acts to close any gaps between wall panels and hold the panels tightly together.

This type of construction has numerous advantages over conventional designs. The parts of the vacuum chamber may be designed as standardized components and manufactured in larger manufacturing runs, may be manufactured in parallel, and/or the manufacturing may be outsourced to specialist manufacturers to reduce lead-times and cost. Final assembly of the components may be performed without customized tooling or heavy machinery, reducing the amount of welding required and simplifying the manufacturing processes and reducing manufacturing time. The modular design provides greater flexibility in shipping the chamber, as the chamber may be shipped disassembled to reduce shipping volume and allow for separate shipment of different components. The modular design also provides greater flexibility in altering the specifications of the vacuum chamber, e.g. the size and shape of the chamber, even after shipment of the chamber from the factory.

Note that the vacuum chamber described herein is suitable for housing a charged particle lithography machine, but may also be used for other purposes wherever a vacuum environment is required. As used herein, "vacuum" does not refer to a perfect vacuum, but to an internal pressure in the interior space of the vacuum chamber that is lower than the pressure in the environment surrounding the chamber. For example, a vacuum of at least $10^{-3}$ mbar is preferred for a charged particle lithography machine, preferably $10^{-6}$ mbar, but other uses of the vacuum chamber may have different requirements for the vacuum to be formed in the chamber. For a vacuum chamber of volume 1 m×1 m×1 m, and a pressure difference across each wall of 1 bar, the force exerted on each 1 m×1 m wall panel is $10^5$ N. The amount of deformation of the wall panels and frame members under this force is preferably smaller than is clearly visible, e.g. less than 10 mm.

Figure 4A:
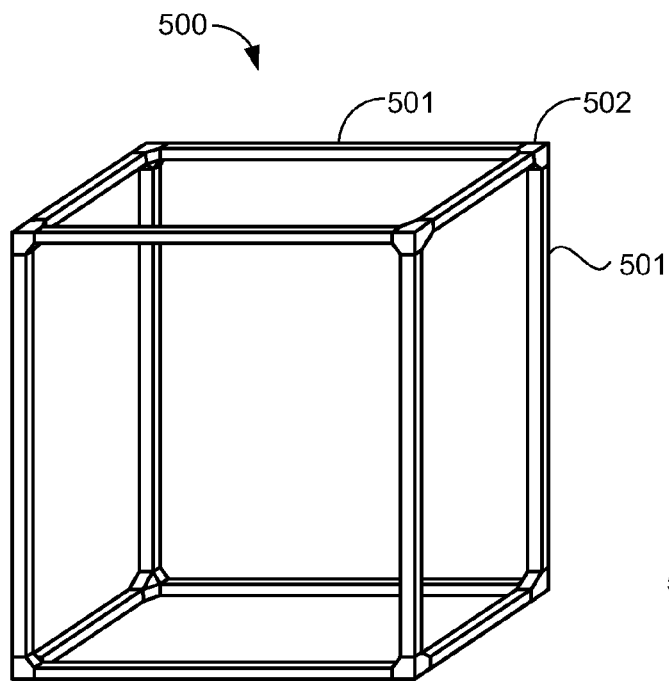
FIG. 4A is a perspective view of a frame for a vacuum chamber.
Figure 4B:
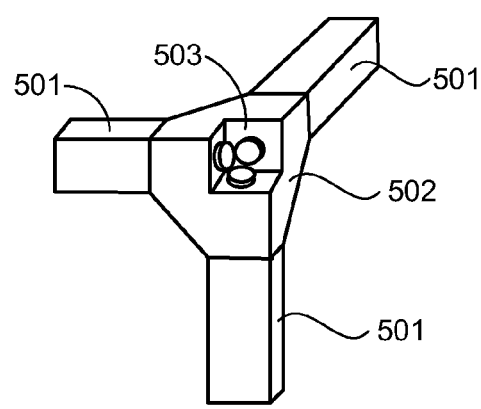
FIG. 4B is a detail view of a corner of a vacuum chamber frame.

FIG. 4A shows a frame 500 for a vacuum chamber, having frame members 501 in the form of rods or struts connected by corner components 502. FIG. 4B shows detail of a corner component 502 connecting struts 501 in one embodiment of the chamber. The corner components 502 may be formed as a part of the frame members 501 in a single piece. For example, some of the frame members may be made with an integral corner component formed at one end or at both ends, while some of the frame members are made without any corner component. In another arrangement, the frame may be formed from two pieces, each comprising four frame members and four corner components formed into one integral piece in the form of a square or rectangle, the two pieces are then connected by four separate frame members to form the assembled frame. Alternatively, the corner components may be omitted entirely so that the frame members 501 connect directly to each other, the end portions of the frame members being adapted for such connection as described in more detail below.

Figure 7A:
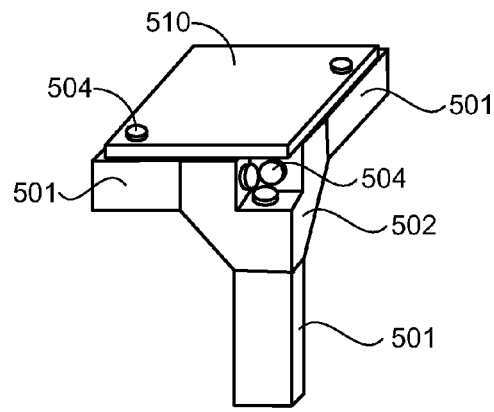
FIG. 7A is perspective view of a corner of a vacuum chamber frame showing a portion of a wall of the vacuum chamber.
Figure 7B:
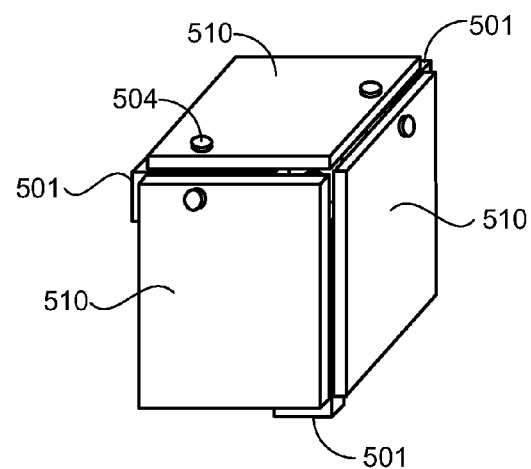
FIG. 7B is perspective view of a corner of a vacuum chamber frame showing a portion of three walls of the vacuum chamber.

Wall panels 510 enclose an interior space to form the vacuum chamber, as shown for example in FIGS. 7A and 7B. The wall panels are removably attached to the frame 500 to form the chamber using connection members which locate the wall panels in a predetermined arrangement, and sealing members are provided at the edges of the wall panels so that a vacuum tight seal is formed at the edges of the wall panels as a result of forming a vacuum in the interior space.

This type of construction permits the vacuum chamber to be constructed from prefabricated and standardized components, of aluminum, stainless steel, or other suitable materials. Standard corner components 502 can be combined with frame members 501, which can be prefabricated in a set of standardized lengths to enable the rapid construction vacuum chambers of varying sizes and shapes. The wall panels can similarly be prefabricated in standardized sizes.

The frame members 501 may be connected to the corner components 502, or to each other, by an adhesive, a pin, bolt, interlocking protrusion, and/or any other suitable connection method. FIG. 4B shows an example of the corner component 502 having a cut-out portion 503 for accommodating a connecting element comprising a pin or bolt 504 for fixing or locating the frame members 501 to the corner components 502. The frame members are preferably also fixed to the corner components using an adhesive, for example Araldite 20/20, applied between the frame members and the corner component.

Cleanliness of the surfaces of the vacuum chamber is often important, particularly when used for a charged particle lithography machine. Cleaning is easiest for large flat structures with low surface roughness, such as provided in the embodiments described herein. It is also preferred to minimize the total surface area inside the vacuum, and to minimize corners and cavities inside the vacuum, to make it easier to clean and reduce other problems such as degassing and outgassing. A simple cubic design is thus beneficial.

The materials used for the components of the vacuum chamber are preferably chosen to limit degassing and outgassing under vacuum. Metals without low vapor pressure compounds are preferred for inside surfaces, and non-metals should be avoided which may lead to contamination from water or organic compounds. Aluminum (without Zinc) is suitable for inside surfaces.

Figure 5A:
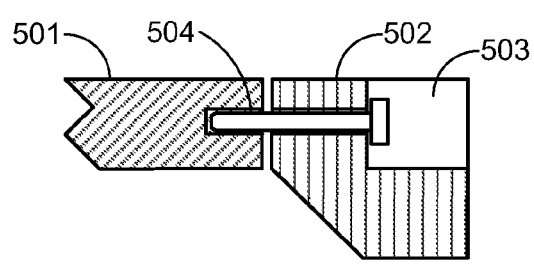
FIGS. 5A-5C are cross section views of a connection between a corner and a frame member of the vacuum chamber.
Figure 5B:
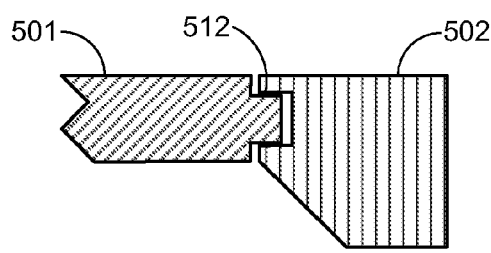
Figure 5C:
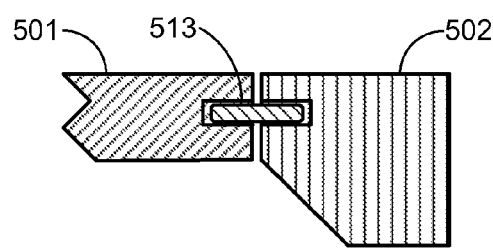

FIG. 5A shows a cross-section through a joint between a frame member 501 and corner component 502, with pin or bolt 504 for fixing or locating the frame members 501 in position. FIG. 5B shows an alternative embodiment, with protrusions 512 formed at the ends of the frame members 501 to interlock with corresponding recesses in the corner part 502. The protrusion may alternatively be formed on the connecting surfaces of the corner components with recesses in the frame member. FIG. 5C shows another embodiment, with a dowel pin 513 fitting into recesses in both the frame members 501 and corner component 502. Adhesive is also preferably used in these embodiments, although it may be omitted. The bolt, pin or protrusion preferably functions to temporarily locate the pieces to be connected (i.e. frame members and corner components) and preferably to apply tension while the adhesive sets. This simplifies assembly and reduces the time when the frame must be attended or left untouched after the adhesive has been applied but before it has set.

Figure 6A:
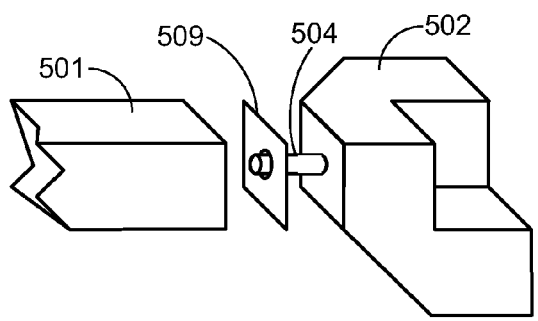
FIGS. 6A-6C are cross section views of a connection between a corner and a frame member of the vacuum chamber including a sealing member or sealing agent.
Figure 6B:
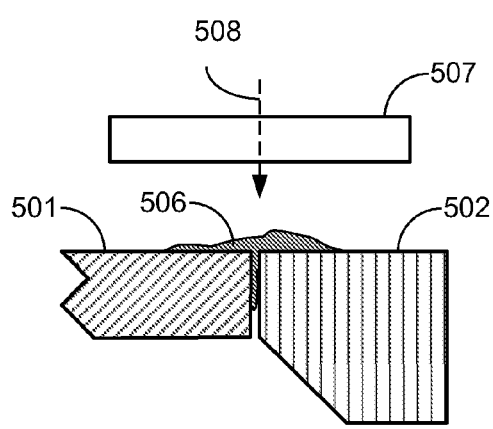
Figure 6C:
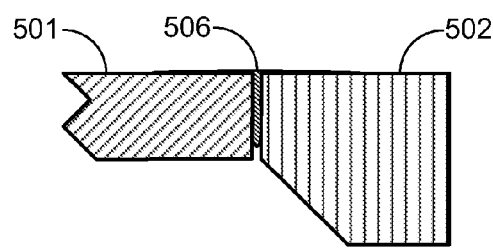

FIG. 6A shows a cross-section through a joint with a sealing member 509 located between the frame member and corner component to improve the seal formed between the joined pieces to improve the vacuum tightness of the vacuum chamber. An adhesive may be used in conjunction with or instead of the sealing member. FIG. 6B shows an adhesive 506 applied between the two pieces. A glue mold 507 may be used to press against the outside surface of the joint (in the direction 508 indicated in the drawing) to flatten the surface of the adhesive and ensure a smooth surface against which a wall panel will rest, as shown in FIG. 6C.

The sealing member may be a sheet, disc, foil, flat washer, O-ring, or similar. A soft metallic material may be used, such as copper or indium, preferably plastically deformable at normal room temperature and pressure, or a synthetic material such as polytetrafluroethylene or PTFE. The sealing member may also comprise a sealing agent such as low volatility vacuum grease or glue. The sealing member may be used in conjunction with the adhesive, or the sealing member may also function as the adhesive.

The wall panels 510 are arranged on the frame as shown in FIG. 7A, showing partial assembly with a single wall panel fixed to the frame, and FIG. 7B showing three wall panels 510 at a corner of the vacuum chamber. The wall panels may be fixed to each other at their edges, and/or fixed to the frame, using various methods as described below.

Figure 8A:
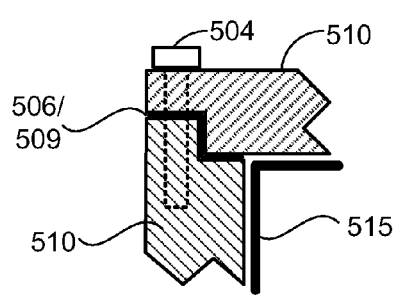
FIGS. 8A and 8B are cross section views of alternative embodiments of a connection between wall panels of a vacuum chamber.

FIG. 8A shows a construction made by attaching the walls together directly at their edges. Two walls 510 with stepped edges are interlocked as shown in FIG. 8A with an adhesive 506 and/or sealing member 509 applied between the adjoining surfaces. An example of a suitable adhesive is Araldite 2020, and a sealing member as described above may be used. A connection member (such as a bolt or locating pin) 504 extending through one wall into a recess in the other wall may be used to locate the walls during the gluing process.

Figure 8B:
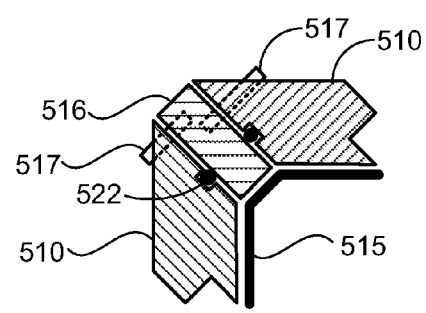

An alternative construction method is shown in FIG. 8B. The edges of the walls 510 are angled and a strip member 516 is positioned between the edges of the walls. Connection members 517 in the form of e.g. bolts or pins, may be used to locate the walls and the strip, and sealing members such as O-rings or C-rings 522 (such as Viton O-rings) or other sealing members as described above may be used to seal the joints between the walls 510 and the strip 516. The connection members 517 are preferably included outside of the O-rings 522. Alternatively the strip member 516 could be omitted so that the angled edges of the wall members 510 are joined directly. A sealing layer 515 may be applied on the inside surfaces if the wall panels to additionally seal the joint.

These constructions result in a self-clamping arrangement where the pressure created by the vacuum in the chamber helps to pull the wall joints together and create a better seal. The interlocking stepped edges of the wall panels in the FIG. 8A embodiment and the angled edges and angled edges (with optional strip member) of the FIG. 8B embodiment, result in one wall panel supporting the other and the joints between the elements being held together more tightly under the forces resulting from pumping down the chamber. Strip 516 together with corner pieces connecting the strip with similar strips with different orientations, may form a self-bearing framework that is incorporated into the vacuum chamber walls.

Figure 9A:
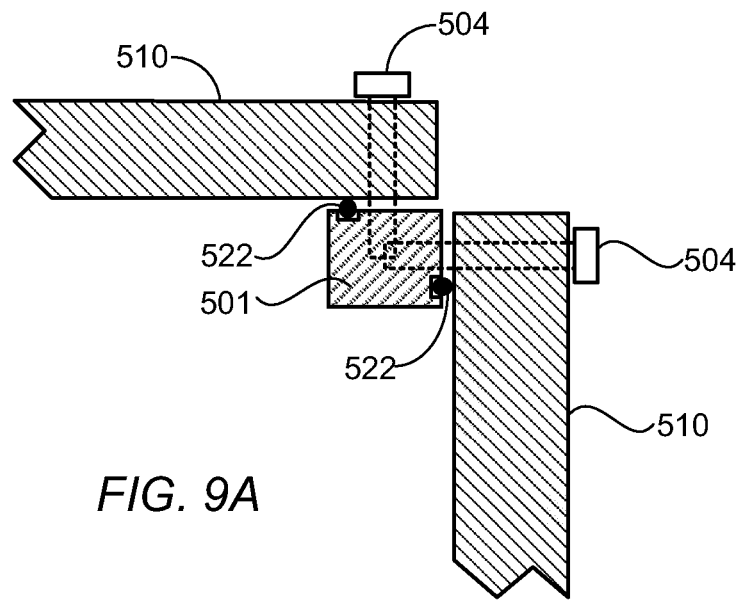
FIGS. 9A-9E are cross section views of various embodiments of a connection between wall panels and a frame member of a vacuum chamber.

FIG. 9A shows an embodiment with wall panels 510 fixed to frame members 501. Connection members 504 in the form of pins or bolts and the like are provided to fix or locate the wall panels to the frame members. Adhesive may also be used to connect the wall panels to the frame members as in previous embodiments. The pins/bolts may pass though the wall panels and into recesses in the frame members as shown in FIG. 9A. Sealing members such as O-rings or C-rings 522 or other sealing members described above may be provided between the wall panels 510 and frame members 501. Recesses to accommodate sealing members such as O-rings or C-rings may be provided on the frame members as shown in FIG. 9A, and/or on the wall panel's inner surface. When the vacuum chamber is pumped down, the force of the vacuum within the chamber pulls the walls 510 into closer contact with the frame member 501, thus assisting in forming a vacuum-tight seal around the edges of the wall panels.

Figure 9B:
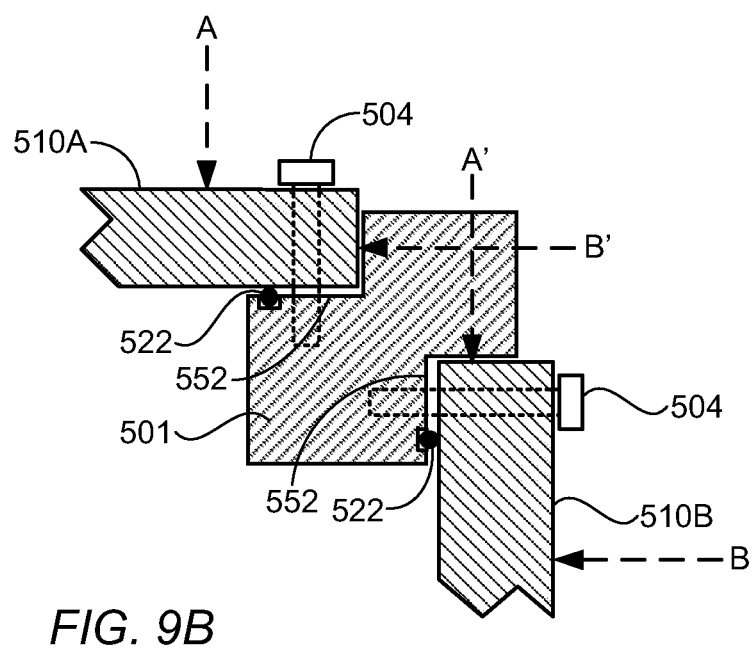

FIG. 9B shows another alternative construction having frame members 501 with a cross section designed to easily locate the wall panels 510A and 510B in the correct position. The frame members may be assembled into a frame with corner components as described above. The wall panels fit into a cut-out portion 552 of the frame member 501. The wall panels 510 may be secured and/or located by connection members 504 and additional sealing may be provided by a sealing member such as an O-ring or C-ring 522 between the wall panel and the frame member. Adhesive may also be used to connect the wall panels to the frame members as in previous embodiments.

Figure 9C:
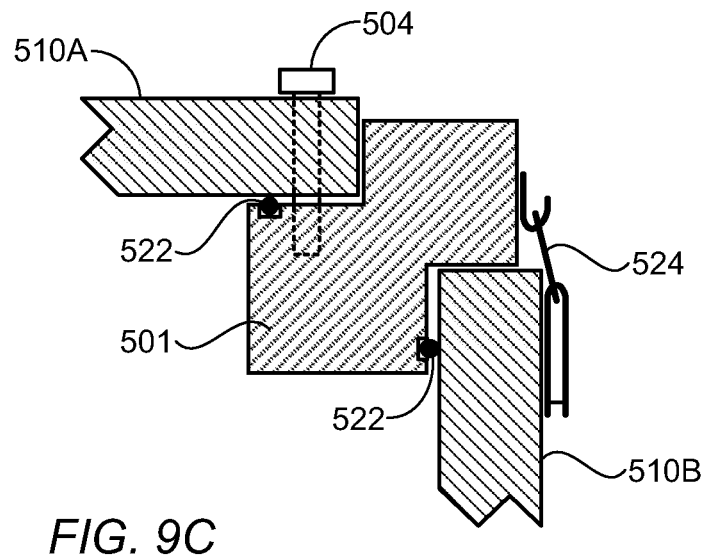

The shape of the frame member 501 results in a robust construction which utilizes the vacuum force to create an air tight chamber. When the vacuum chamber is pumped down, the vacuum in the chamber will exert force pushing the wall panels inwards. This force is represented schematically by the arrows A and B in FIG. 9B. The force in direction A will act to push wall 510A against the frame member 501, reducing any gaps between them and improving the seal between them. It can be expected that the frame member may bend slightly when a sufficiently high vacuum is produced in the chamber. However, due to the shape of the frame member, it will be reinforced by the adjoining wall panel 510B. When wall 510A pushes against frame member 501 with sufficient force, the frame member will push against the end of wall panel 510B (represented schematically by the arrow A' in FIG. 9B), preventing further distortion of the frame member. A similar effect will occur as a result of force in a direction B. When wall 510B pushes against frame member 501 with sufficient force, the frame member will push against the end of wall panel 510A, preventing further distortion of the frame member. This results in a simple modular construction that FIG. 9C shows a variation of the construction shown in FIG. 9A. One wall panel is arranged as shown in FIG. 9A, while the other is fixed to the frame member 501 with a quick release latch 524. Adhesive may also be used to connect the wall panels to the frame members and a sealing member as well as in previous embodiments.

Figure 9D:
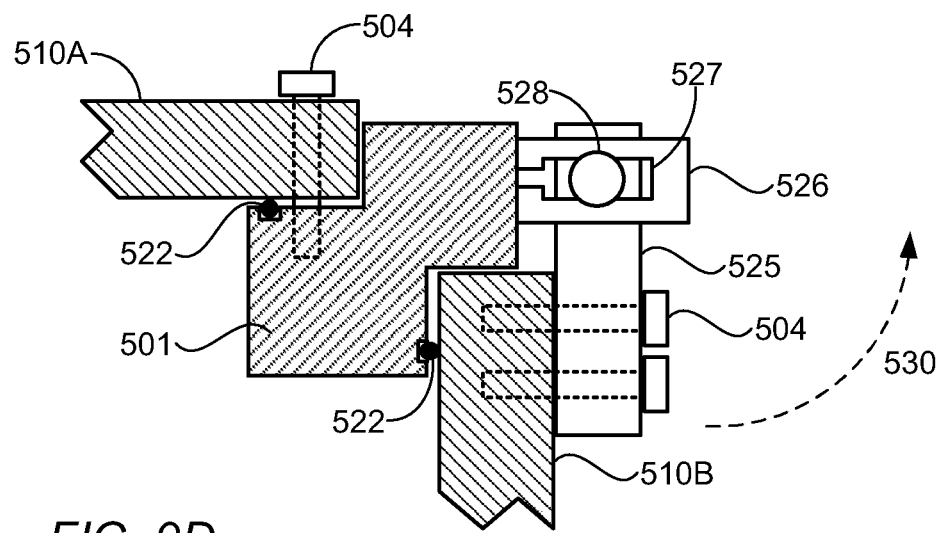

FIG. 9D shows another variation of the construction shown in FIG. 9A, with one wall panel mounted on a hinge arrangement. A protrusion 526 from the frame member 501 includes a slot 527 for receiving a hinge pin 528. A corresponding connection piece or protrusion or extension of wall panel 525 also includes a hole for receiving the hinge pin 528. This enables a simple construction to utilize one (or more) of the wall panels as a door for the vacuum chamber, hinging in direction 530. The connection piece 525 is shown in the drawing with pins or bolts 504 for attachment to the wall panel 510B, although other means of attachment could equally be used, such as gluing, welding, etc. The other edges of wall panel 510B may be fixed to corresponding frame members in the same manner as wall panel 510A, and sealing members used as in previous embodiments. Alternatively, wall panel 510B may have a hinge arrangement on one or more of its other edges. In one embodiment, the wall panels on the sides of the vacuum chamber are all mounted to the frame using a hinge arrangement on each vertical edge of the wall panels.

The hinge arrangement is preferably designed with sufficient play in the hinges to allow the wall panel 510B to move inwards and seal against the frame member 501 (and the O-ring or C-ring 522 or other sealing member if present) under the force exerted by a vacuum in the pumped-down chamber. This play is provided, for example, by the slot 527 in the embodiment of FIG. 9D. The hinge pin 528 may be designed for easy assembly and disassembly on site for easy initial assembly and for complete removal of the wall panel 510B from the chamber if necessary.

Figure 9E:
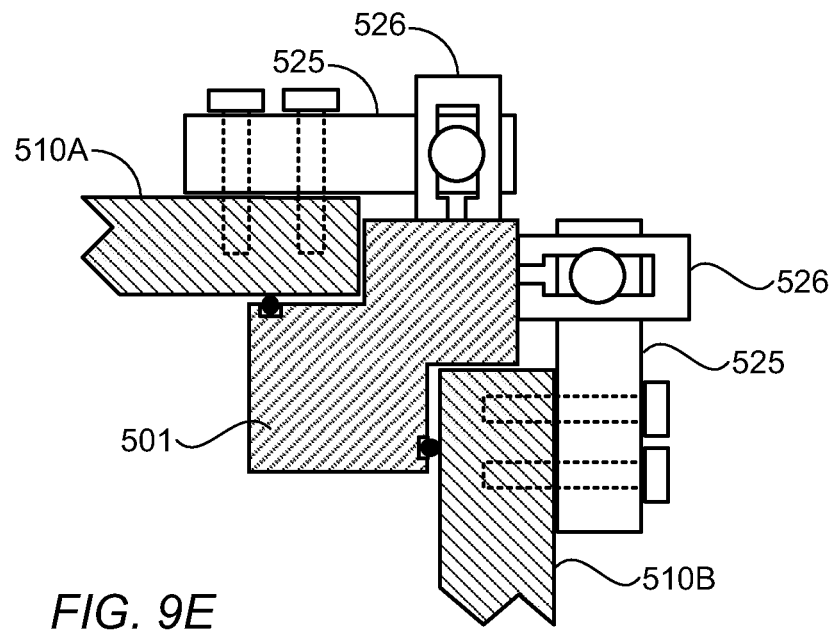

One or more of the wall panels of the chamber may be hinged similarly to wall panel 510B, to provide one or more doors for the chamber. FIG. 9E shows such a design, with both doors 510A and 510B being attached to frame member 501 using hinge arrangements. At least one door preferably forms as the entire wall of the vacuum chamber. This arrangement provides the maximum width and height for moving components of the lithography system into and out of the chamber, which is an important advantage in a lithography system having a modular design. It allows sliding out of a module, and subsequently exchanging it, for example to be serviced, without a need to enter the vacuum chamber.

Figure 10:
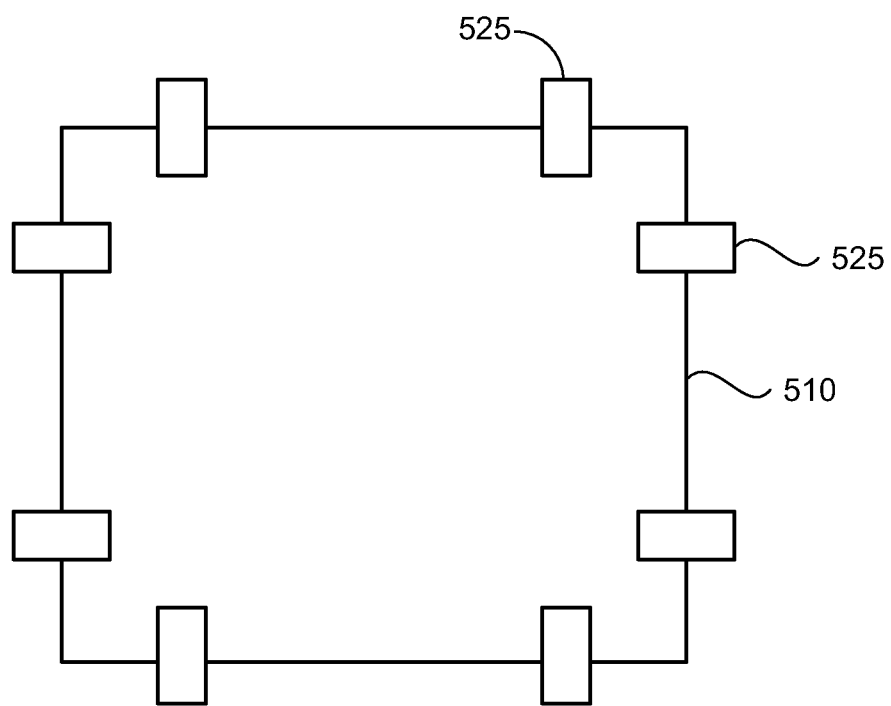
FIG. 10 is a wall panel of a vacuum chamber with connecting pieces.

The wall panels may be attached to the frame by hinge arrangements at all their edges. FIG. 10 shows a wall panel 510 having connection pieces 525 on every edge of the wall for attachment to the frame using a hinge arrangement as described above. The door or doors may be arranged to open sideways, upwards, or downwards. In some arrangements the doors may be arranged to open substantially vertically, to minimize the floor space required for the lithography machine. This arrangement permits other equipment or a wall to be located in relatively close proximity to vacuum chamber, or avoids having the door block required working or access space. In some embodiments the door is mounted on hinged arms to enable the door to swing upwards, and in other embodiments the door is opened by a lift system.

The hinged wall panels functioning as doors are preferably light enough to manually remove from the chamber. Whereas previous vacuum chamber designs have featured doors weighing in the order of 300 kg, the preferred embodiments of the vacuum chamber have smaller wall panels/doors made using a laminated construction with aluminum, and weighing in the order of 25 kg.

FIGS. 11A and 11B show additional details of a hinge arrangement. FIG. 11A is an end view of a wall panel 510B attached to frame member 501, showing the arrangement of connection piece 525, protrusions 526, and hinge pin 528. A clip 529 may be used to maintain the hinge pin in place. FIG. 11B shows a cross section through a single piece forming both protrusions 526, and showing the connection piece 525 in a rotated position corresponding to the wall panel/door being open. In this design, bolts 531 attach the protrusion piece 526 to a frame member, the bolts being located in recesses 532 so that the hinge pin 528 retains the bolts 531 in the recesses 532.

FIG. 12 shows show yet another arrangement in which the wall panels are attached directly to each other. In the embodiment shown, the panels 510A and 510B are attached to each other using a hinge arrangement (connecting pieces 525 and hinge pin 528) although many other means may be used, such as latch, clamp, or other connecting device.

Figure 13:
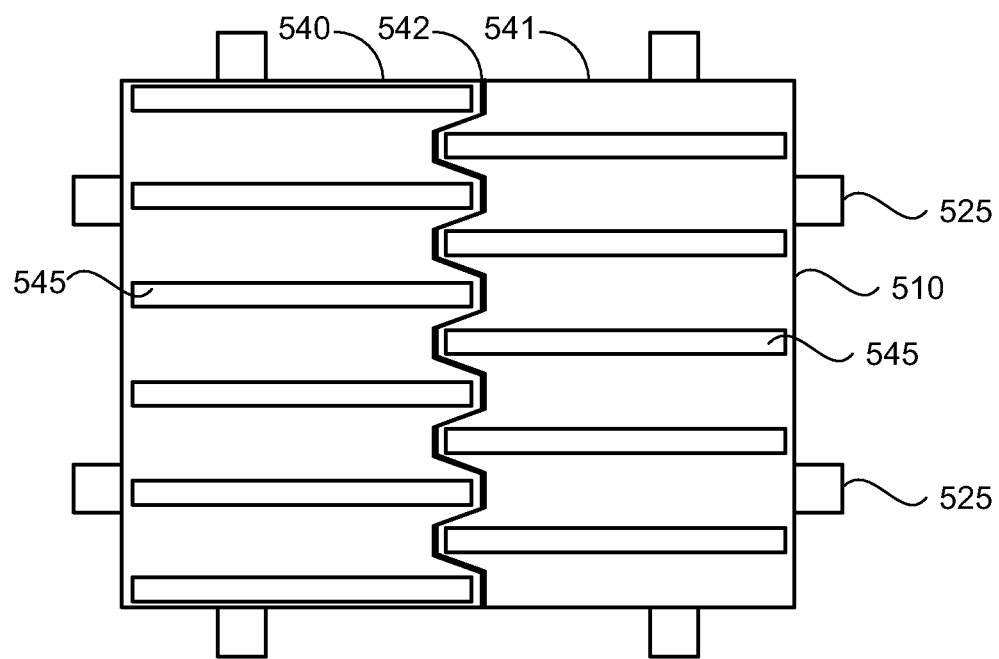
FIG. 13 is a wall panel of a vacuum chamber divided into door panels.

FIG. 13 shows a wall panel 510 of a vacuum chamber divided into two door panels 540 and 541. The edge 542 where the door panels meet has an undulating shape to facilitate sealing between the door panels. Cross beams 545 may be used for reinforcing the wall panels to increase the stiffness and strength of the panels.

Figure 14A:
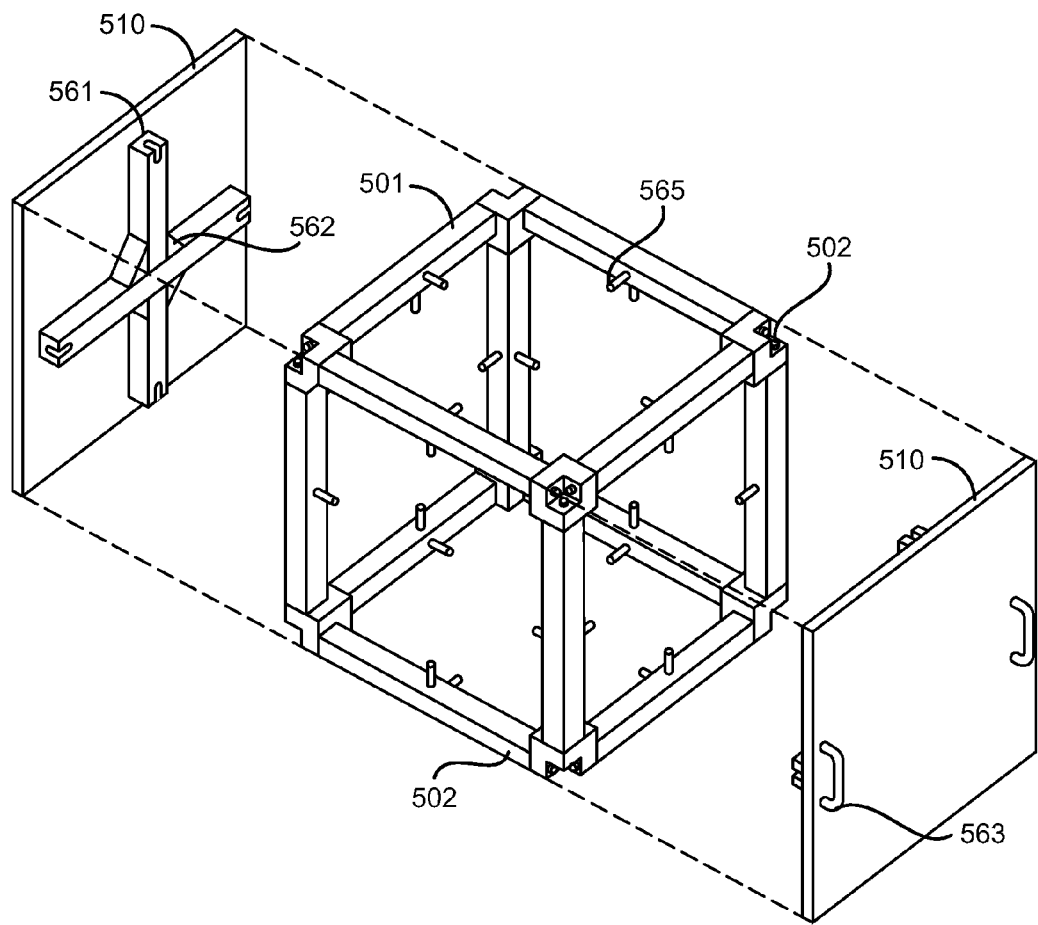
FIG. 14A is a perspective view of an arrangement of wall panels with strengthening members for a vacuum chamber.
Figure 14B:
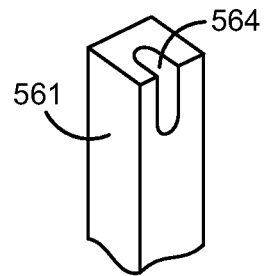
FIGS. 14B-14D are detail views of the arrangement of FIG. 14A.
Figure 14C:
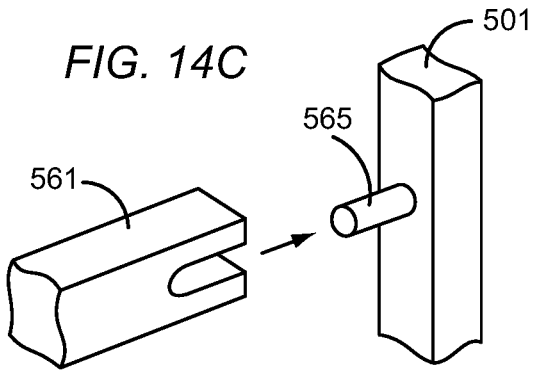
Figure 14D:
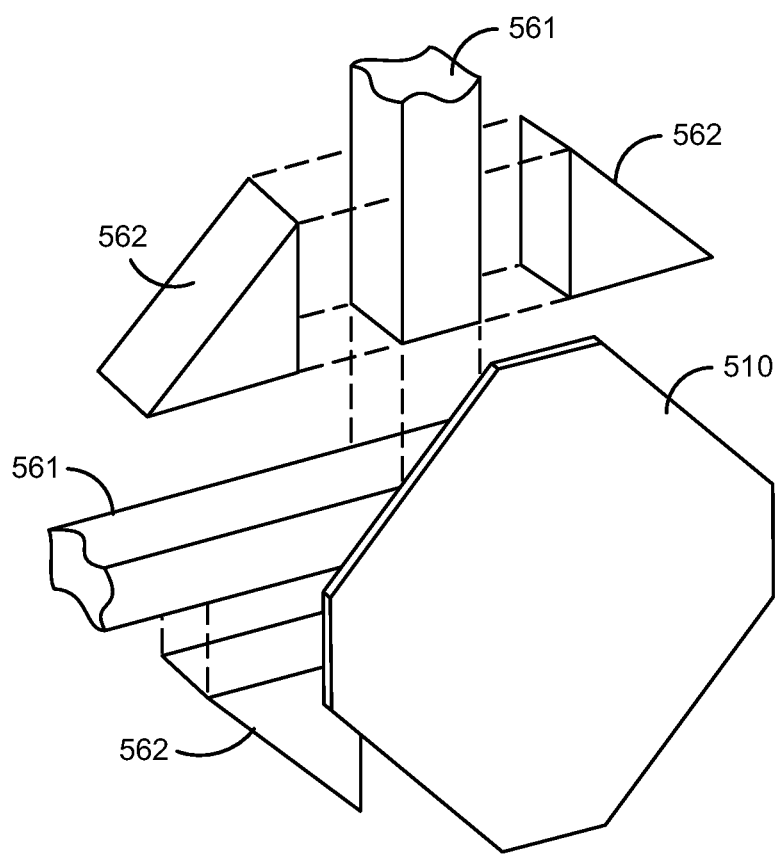

FIG. 14A shows another arrangement of a modular vacuum chamber. The chamber comprises a frame with frame members 501 and corner components 502. The corner components may be formed as part of the frame members, or omitted. The wall panels 510 are constructed with cross members 561, positioned on the inside surface of the wall panels in the embodiment depicted. FIGS. 14B-14D show additional details of the vacuum chamber. Cross members 561 have slots or recesses 564 formed at their ends, which engage with pins or protrusions 565 attached to the frame members 501 in corresponding positions. The embodiment depicted includes one horizontal and one vertical cross member on an inside surface of each wall panel, although different numbers of cross members may be used, positioned horizontally, vertically or obliquely. Angle elements 562 may also be included to further strengthen the arrangement.

With this arrangement, the wall panels may be put in place and removed when necessary. The wall panels fit into place against the frame members, and the cross members and slots/recesses 564 mating with pins/protrusions 565 function to locate the wall panels in position. The wall panels are preferably light enough so that they can be lifted by a single person or two people without requiring lifting equipment or hinge arrangement to support the weight of the panels. Handles 563 may be provided to assist manual placement and removal of the wall panels.

FIG. 14E shows various configurations of a corner component 502 for use in the vacuum chamber, with a cut-out portion 503 for accommodating connection members (e.g. pins or bolts 504) and holes or recesses 505 for receiving the connection members.

FIGS. 14F-14G show a corner component 502 and frame members 501 including a groove or recessed portion 570 for accommodating a sealing member such as an O-ring or C-ring. The groove is located to position the sealing member to form a seal between the frame and the wall panels. As shown in FIG. 14G, the groove 570 may be located for sealing around the edges of one or more of the wall panels. Any of the sealing members described for the other embodiments may also be used for this embodiment, for sealing between corner components and frame members, and/or between the frame and the wall panels.

The corner points of the vacuum chamber are critical points for achieving vacuum tightness. The grooves at the corner components operate to guide the sealing member and ensure a vacuum tight seal at the corners of the chamber. The seal can also be improved at the corners, and at other locations around the edges of the wall panels, by gluing the frame members and corner components, and by surface finishing the areas where the various components are joined. A final milling stage may also be performed after assembly of the frame members and corner components to ensure a smooth surface for sealing against the edges of the wall panels. The roughness on surface where the seal is formed in preferably about 0.8 Ra.

Figure 14H:
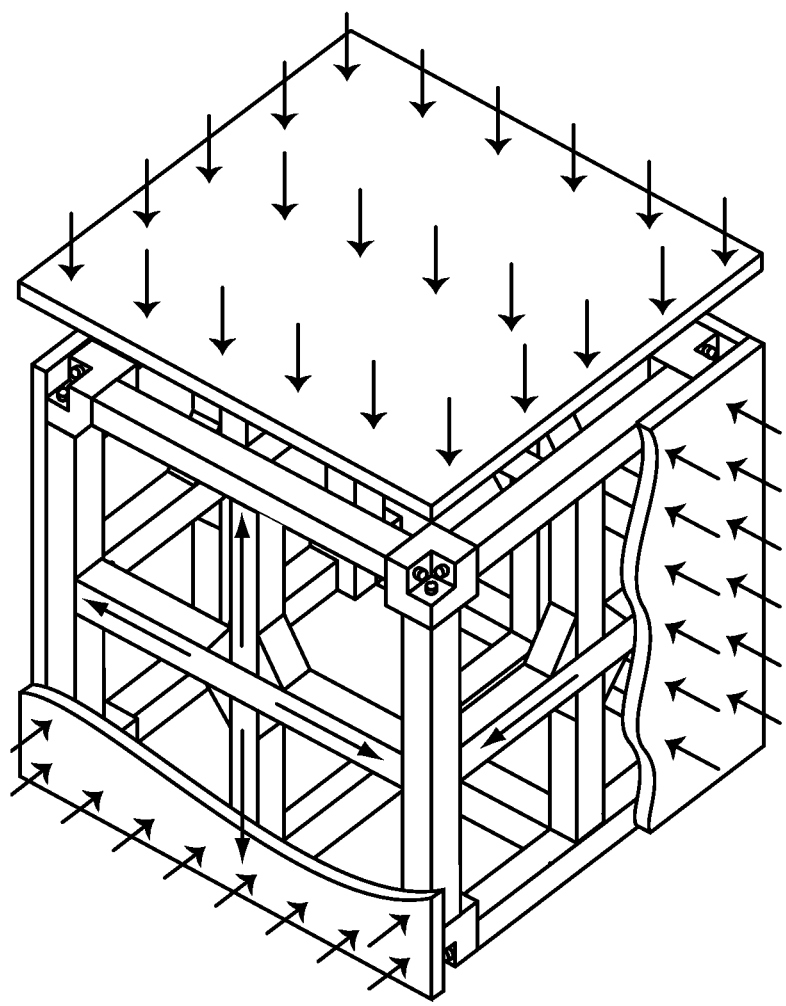
FIG. 14H is a perspective view of forces on the vacuum chamber of FIG. 14A.

FIG. 14H shows a cut-away view of the vacuum chamber of FIG. 14A showing the forces acting on the structure when a vacuum if formed in the interior space of the vacuum chamber. When a vacuum is formed in the interior space of the chamber, the atmospheric pressure outside the chamber will exert a force on the wall panels, pushing them inwards more tightly against the frame. This force assists in forming a better seal around the edges of the wall panels against the frame. The force exerted on the wall panels is transmitted to the frame members, which will tend to bend slightly inwards under the pressure when a high vacuum is formed in the chamber. In this embodiment, the cross members provide additional support by exerting an opposing force to reduce or prevent bending of the frame members and increase the rigidity of the structure.

In all of the embodiments described above, the connection members may be adapted to locate the wall panels while providing for a small predetermined range of movement of the wall panels. By permitting the wall panels to move slightly, the connection members allow the wall panels to move inwards by a small amount and seal more tightly against the sealing members when a vacuum is formed in the interior space of the vacuum chamber, so that a vacuum tight seal is created by the action of forming a vacuum in the chamber. The connection members may be designed to locate the wall panels in place without actually providing a vacuum tight seal at the edges of the wall panels. Instead, the connection members may provide a near vacuum tight seal at the edges of the wall panels. The vacuum tight seal is created when the wall panels are pushed inwards by the force of atmospheric pressure outside the chamber when a vacuum is formed inside the chamber. The connection members may act to guide the wall panels towards a position in which the vacuum tight seal is formed at the edges of the wall panels.

The vacuum is formed in the vacuum chamber by using a vacuum pump which has a pumping capacity that is sufficiently higher than the flow rate of air leaking into the chamber to enable a vacuum tight seal to be formed around the edges of the wall panels. The leak rate into the chamber is dependent on the design of the chamber and the types of sealing members used. Gas leak through metal seals is negligible at a pressure of $10^{-6}$ mbar across the seal, but a typical O-ring seal is permeable to gasses. Approximate permeation rates for a 5 mm diameter O-ring for water is about $1.8 \times 10^{-6}$ mbar-liter per second per meter of O-ring length, for nitrogen about $0.8 \times 10^{-6}$ mbar-l/s/m, and for oxygen about $0.2 \times 10^{-6}$ mbar-l/s/m. A vacuum chamber of size 1 m×1 m×1 m with a single sealing member for sealing around the four edge regions of each wall panel has a total sealing member length of approximately 24 m, and a permeation rate for water of about $43 \times 10^{-6}$ mbar-l/s. This is typically only a small percentage of the vacuum pump capacity.

The vacuum pump is connected to the interior space of the vacuum chamber, e.g. through a port as described below. The walls are put in place to enclose the interior space and the pump is operated to remove air from the chamber. As the vacuum pump reduces the pressure inside the chamber, air will leak into the chamber around the edges of the wall panels where a vacuum tight seal has not yet been formed. As the pressure inside the chamber drops, the external pressure will exert a force on the wall panels, pushing them more tightly against the frame and forming a better seal around the edges of the wall panels. If the air displacement capacity of the vacuum pump is sufficiently larger than the flow rate of air leaking into the interior space, the force acting on the wall panels will be sufficient to produce a vacuum tight seal and the desired vacuum can be formed in the chamber.

Vacuum Chamber Configurations

The vacuum chamber 400 constructed according to any of the above embodiments may be configured in a variety of ways to accommodate lithography machines or other types of equipment having different shapes and sizes. FIG. 15A shows a vacuum chamber 400 configured with a main portion 470 with square or rectangular cross-section, with additional portions 471 in the form of a side column and 472 in the form of a protruding box. These additional portions may be constructed using the same modular type construction described above, utilizing frame members, corner components, and wall panels. FIG. 15B shows a side wall panel 510C with a cutout portion 550 to accommodate the side column 471, so that the main portion 470 and side column 471 form a vacuum chamber with one single internal volume.

FIG. 15C shows an exploded view of a column portion 471 attaching to a main vacuum chamber portion 470. The column portion 471 comprises frame members 501A and corner components 502. The frame members of the column portion 471 may be connected to additional frame members 501B of the main portion, using bolts or pins extending into recesses or holes 547 in the frame members 501B. These recesses or holes may be pre-drilled and plugged for rapid assembly on site, to enable the construction of bolt-on extensions to the vacuum chamber. A set of holes may be pre-drilled in standardized positions along the frame members 510B to enable rapid assembly of the frame in a variety of configurations depending on the varying requirements for the vacuum chamber.

These extensions can be arranged to accommodate various parts of the lithography machine which protrude from the main body of the machine, outside of a regular cubic or rectangular outline. The wall panels may be attached to the frame with the extensions added so that a single vacuum enclosure is created, including the main portion and some or all of the extensions. Alternatively, the wall panels may be attached in a manner that creates multiple separate vacuum enclosures.

Figure 16A:
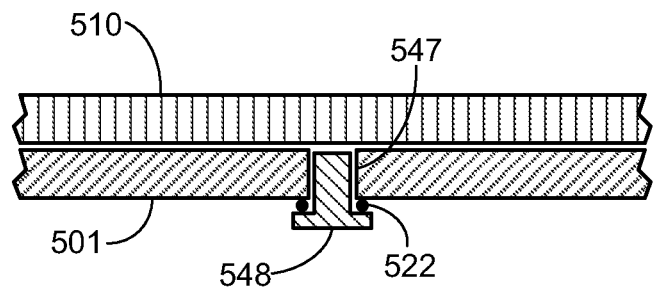
FIGS. 16A-16C are detail views of plug various arrangements for plugging holes in a frame member.
Figure 16B:
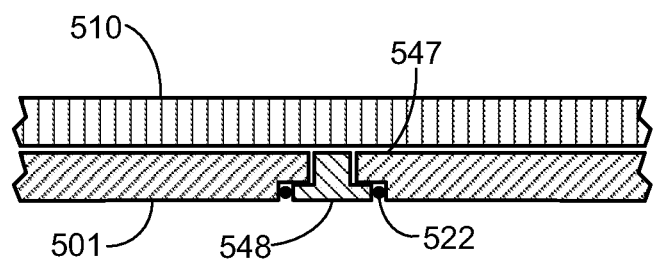
Figure 16C:
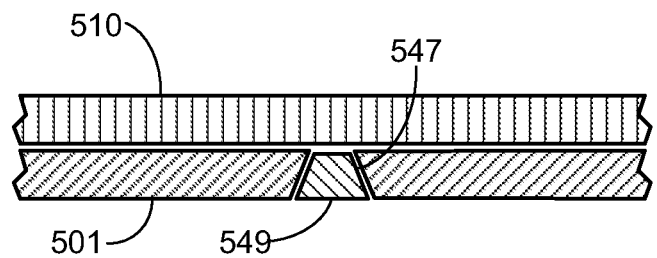

FIGS. 16A-16C show various arrangements for plugging the pre-drilled holes or recesses 547 in a frame members 501, with a pin or bolt 548 or stopper 549. A sealing member such as an O-ring or C-ring 522 may be used with any of these arrangements.

FIG. 17A illustrates a cubic vacuum chamber housing a lithography machine comprising a stage assembly 920, an electro-optical column 921, and a source chamber 922. As can be seen in the drawing, the square shape of the vacuum chamber results in a large amount of unused space within the chamber, particularly in the areas 240 (note that the drawing is only a two-dimensional representation and does not show a similar effect that may occur in the front and back areas of the chamber). This unused space unnecessarily increases the volume of the vacuum chamber, resulting in a larger volume to pump down and a slower pump-down or the need for larger vacuum pumps. The unused space also consumes space in the fab that might have been used for housing additional equipment.

As shown in FIG. 17B, the vacuum chamber may be constructed to reduce the unused space in the vacuum chamber. In FIG. 17B, the vacuum chamber 400 is configured to more closely match the outlines of the lithography machine, resulting in a narrower upper portion and wider lower portion. This results in a smaller volume to pump down and frees up space to locate equipment racks or cabinets 477 and other equipment (such as vacuum pumps) next to the vacuum chamber without consuming additional floor space in the fab and without increasing the height of the complete assembly. This arrangement assists in achieving the stacked vertical arrangement shown in FIG. 3B, and may reduce the height of a typical assembly from about 3 m to about 1.5 m-1 m. As the standard ceiling height of a clean room is 3.5 m, this arrangement may permit three vacuum chambers (with associated equipment) to be stacked, preferably on shelving of other supports.

The equipment racks or cabinets 477 may be used to house high voltage control circuitry and beam switching and beam scan deflection electronic circuitry, which is preferably located in close proximity to the lithography machine. Connections from this equipment to the lithography machine in the vacuum chamber can then be made using very short connecting cables and wires located at the sides of the racks or cabinets as indicated by the arrows 478.

FIG. 17C shows a perspective view of a vacuum chamber configured as in FIG. 17B, comprising a narrower top portion 475 and a wider lower portion 476. Tracks 479 may be provided for sliding the equipment racks or cabinets for ease of maintenance access. As described above, equipment may be arranged around the top portion 475 and above the lower portion 476. In one arrangement, the vacuum pumps which require less frequent access are located behind and/or in front of the top portion 475, and the electrical and electronic circuitry for the lithography machine is located in racks or cabinets at the sides of the top portion 475 where they can be more easily accessed.

Frame without Corner Components

As described above, the vacuum chamber frame 500 may be constructed without the use of corner components. In these embodiments, the frame members 501 may be made with interlocking end portions to enable secure connections to be made between the frame members at the corners. These connections are preferably made so that the forces exerted when a vacuum is formed in the chamber will act to push the frame members more tightly together so that they seal more tightly against each other, and so that the frame members interlock to form a strong and rigid construction to oppose these forces.

Figure 18A:
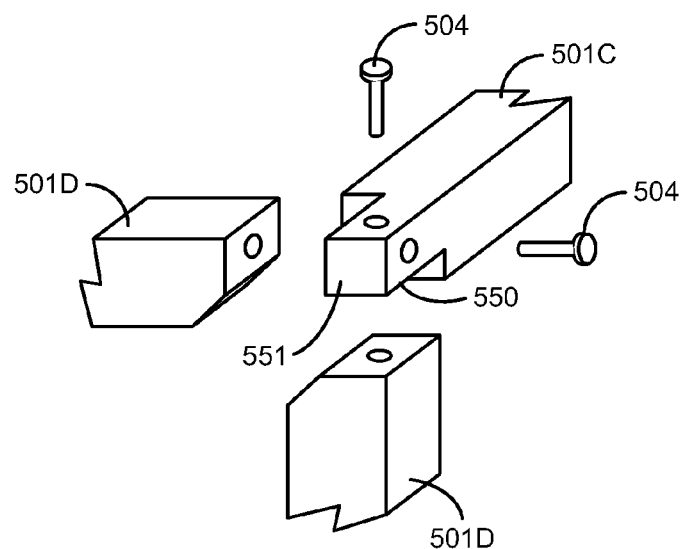
FIG. 18A is a perspective exploded view of a connection between frame members without a corner component.
Figure 18B:
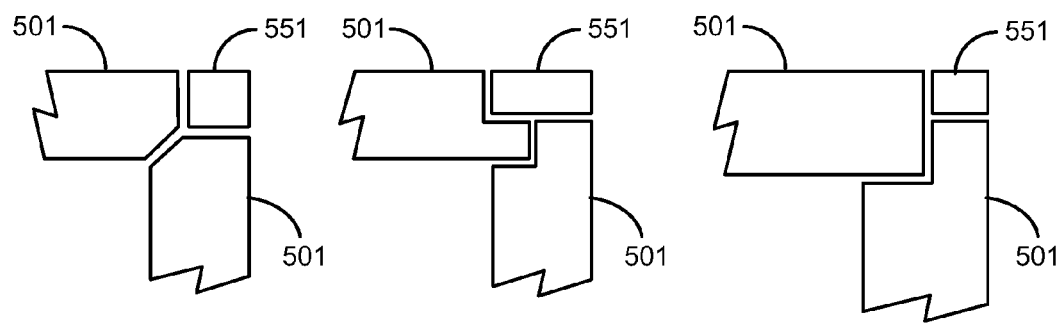
FIG. 18B is a side view of various arrangements of a connection between frame members without a corner component.

FIG. 18A shows an exploded view of a connection between frame members without a corner component. A frame member 501C has an end region for interlocking with an end region of other frame members, with a cut-out portion 550 for accommodating the end portions of frame members 501D. A protruding portion 551 overlaps the ends of frame members 501D and has holes or recesses for accommodating connection members 504 for connecting to the frame members. An adhesive and/or sealing member such as described above may be used between the frame members. Various different arrangements are possible for connecting the frame members in an interlocking fashion without a corner component, as shown for example in FIG. 18B, showing an end view of the connected frame members.

Figure 19A:
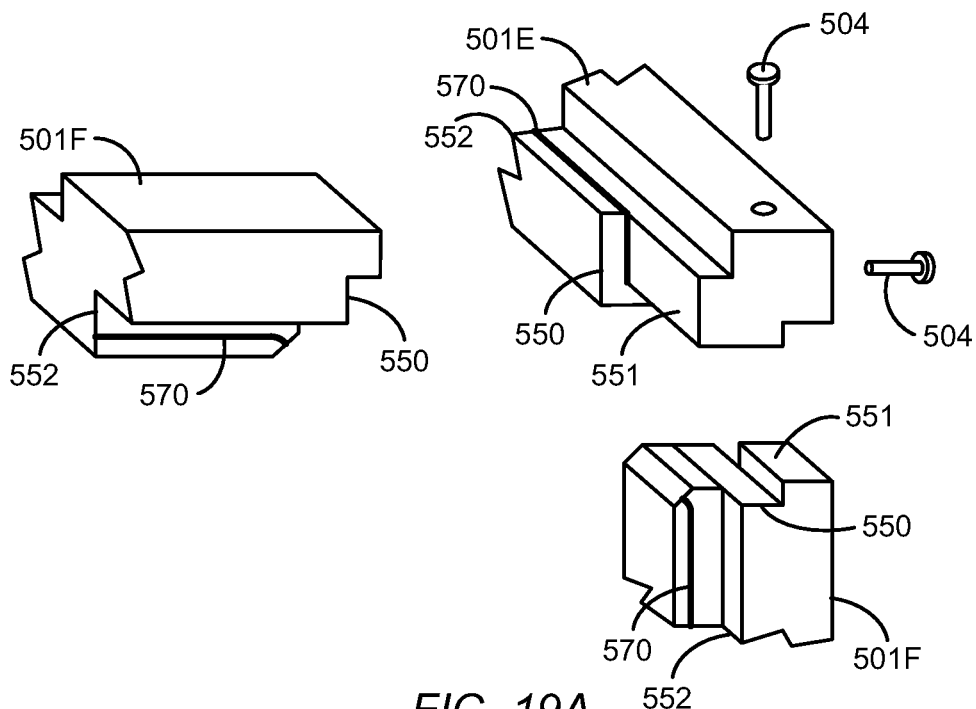
FIG. 19A is a perspective exploded view of an alternative connection between frame members without a corner component.
Figure 19B:
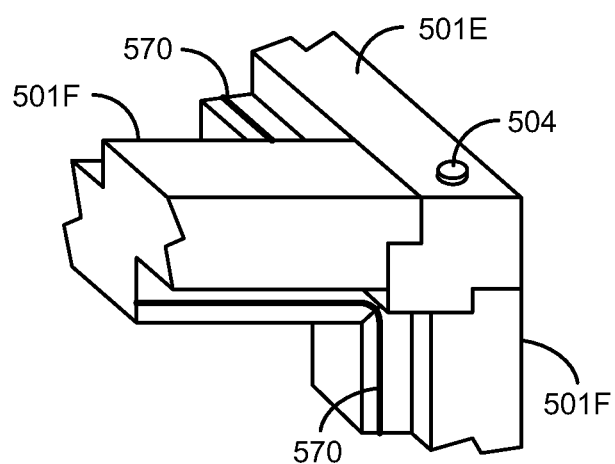
FIG. 19B is a perspective view of the connection of FIG. 19A when assembled.

FIG. 19A is an exploded view of an alternative connection between frame members without a corner component, and FIG. 19B shows the frame members when assembled. The frame members in this embodiment have a cross-sectional profile with two recessed or cut-out portions 552 for accommodating an edge of two perpendicular wall panels, similar to the profile of the frame member shown in FIG. 9B. A frame member 501E has an end region for interlocking with an end region of other frame members, with a cut-out portion 550 for accommodating the end portions of frame members 501F. A protruding portion 551 overlaps the ends of frame members 501F and has holes or recesses for accommodating connection members 504 for connecting the frame members. An adhesive and/or sealing member such as described above may be used between the frame members. Various different arrangements are possible for connecting the frame members in an interlocking fashion without a corner component as will be recognized by one of skill in the art. The frame members of this embodiment also form an interlocking arrangement with the wall panels as described for the embodiment of FIG. 9B, so that a force exerted against an outside surface of one wall panel results in a first wall panel sealing more tightly against the cut-out portion of the frame member and other cut-out portion of the frame member pushing against an end of the second wall panel.

A recess or groove 570 may be provided in the recessed or cut-out portion 552 of the frame members, for accommodating a sealing member such as an O-ring or C-ring. The edges of the wall panels are arranged to sit within the cut-out portion 552 so that the inside surface of the wall panel interfaces with the sealing member in the groove 570, to form a seal between the frame and the wall panel. Any of the sealing members described for the other embodiments may also be used for this embodiment.

Frameless Construction

The same principle described above for a modular vacuum chamber with a frame may also be achieved in a construction that does not have a separate frame structure. FIG. 8A shows a vacuum chamber with wall panels attached together directly at their edges. Two walls 510 with stepped edges are interlocked, with an adhesive 506 and/or sealing member 509 between the adjoining surfaces. A connection member (such as a bolt or locating pin) 504 extending through one wall into a recess in the other wall may be used to locate the walls.

Figure 20A:
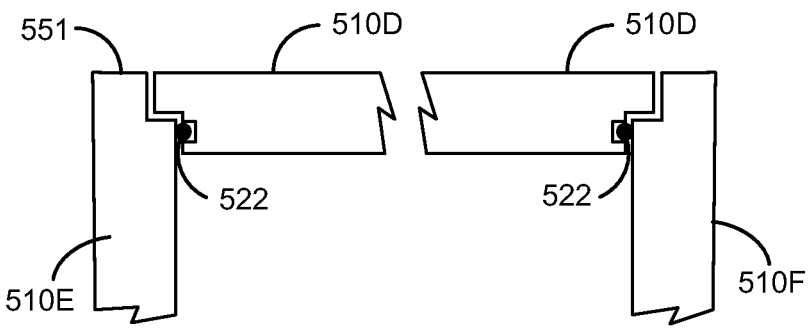
FIG. 20A is a cross section view of a connection between wall panels without a frame.
Figure 20B:
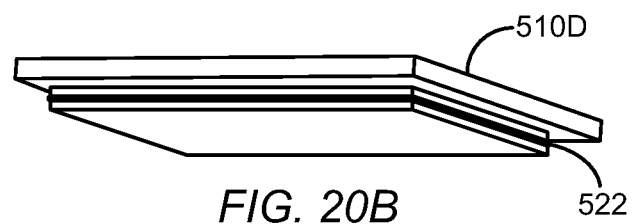
FIG. 20B is a perspective view of a wall panel with sealing member.

FIG. 20A shows the same type of construction with a sealing member such as an O-ring or C-ring 522 in a groove or recess on the interlocking portion of the wall panel, for sealing between the wall panel 510D and wall panels 510E. Connection members may be used to connect the wall panels to each other, such as shown in FIG. 8A. FIG. 20B shows the wall panel 510D in three dimensional view with sealing member 522 positioned along all four sides of the stepped edge. The sealing member may be held in this position in a groove, or may be adhered to the wall panel by vulcanizing the sealing member to wall panel edge, or by using an adhesive. This assists in on-site assembly of the vacuum chamber.

These constructions result in a self-supporting and self-clamping arrangement where wall panels interlock with each other to help support and locate each other in position. When a vacuum is formed in the chamber, the resulting forces push the wall joints together more tightly and create a better seal, so that a vacuum tight seal is formed. The interlocking stepped edges of the wall panels, or angled wall panel edges (with optional strip member as shown in the FIG. 8B embodiment) result in one wall panel supporting the other and the joints between the elements being held together more tightly under the forces resulting from pumping down the chamber.

Figure 21:
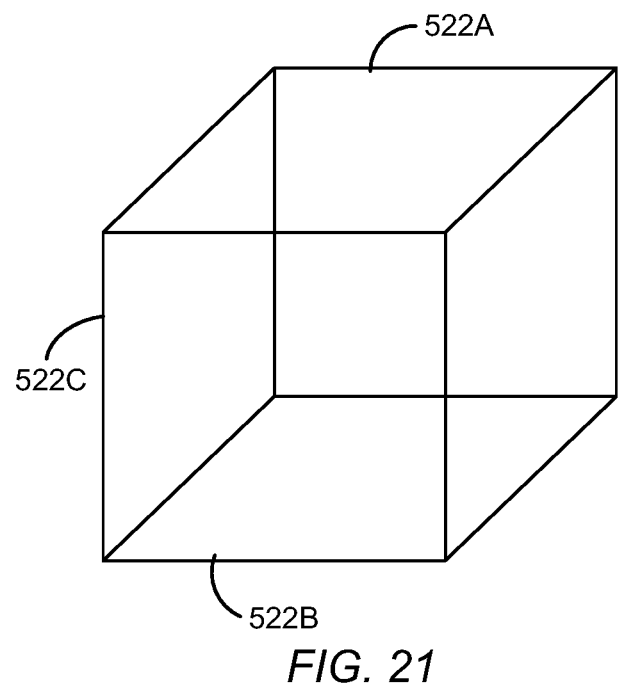
FIG. 21 is a perspective view of an O-ring construction.

A three dimensional sealing member may be used for these embodiments and other embodiments of the vacuum chamber. FIG. 21 shows an O-ring or C-ring formed in a three dimensional cubic form, for fitting around the edges of the wall panels during assembly. The sealing member may also be formed as two loops 522A, 522B, each loop being fitted to a wall panel as shown in FIG. 20B, e.g. for the floor and ceiling panels, and four lengths 522 for sealing between the other four wall panels forming the chamber.

In these embodiments, the wall panels are removably attached to each other using the connection members, rather than being attached to the frame as in some of the other embodiments described herein. The interlocking regions of the wall panels inhibit movement of the panels under the influence of a vacuum formed in the interior space of the chamber. The stepped edges forming an interlocking arrangement in which a force exerted against an outside surface of a first wall panel results in the first wall panel sealing more tightly against the stepped edge of a second wall panel, and a force exerted against an outside surface of the second wall panel results in the second wall panel sealing more tightly against the stepped edge of the first wall panel. An adhesive may be used between opposing stepped edges of the wall panels, and connection members may be used to locate the wall panels.

Suitable construction details of the vacuum chamber components for a 1 m×1 m×1 m chamber for sustaining a vacuum of $10^{-6}$ mbar are provided below, for embodiments of the chamber with a frame where the frame members act as structural elements of the chamber, and without a frame where the wall panels are structural elements of the chamber. Where a frame is included as a structural element of the chamber, solid aluminum frame members with a cross section of 70 mm×70 mm, deformation under vacuum of 9.4 mm, and weight of 14 kg may be used, for a total weight of the frame members of 168 kg per chamber. Hollow aluminum frame members may be used, with a cross section of 120 mm×120 mm and wall thickness of 5 mm, deformation of 3.7 mm, and a weight of 6.25 kg each and total weight of frame members of 75 kg per chamber. Both of these options may be manufactured in relatively small quantities, and are also suitable for mass production.

Where the wall panels are used as structural elements of the vacuum chamber, a solid aluminum wall panel of thickness 15 mm may be used, deformation under vacuum of 19 mm, and weight of 41 kg per panel, for a total weight of wall panels of 246 kg per chamber. A thicker solid aluminum wall panel of 20 mm thickness may be used, deformation of 8 mm, and weight of 54 kg per panel, for a total weight of wall panels of 324 kg per chamber. A lighter and stronger composite sandwich wall panel may be used of thickness 60 mm, deformation of 1.6 mm, and weight of 16.2 kg per panel, for a total weight of wall panels of 97 kg per chamber. The solid wall panels may be manufactured in relatively small quantities, and are also suitable for mass production, but the composite wall panels are more difficult to mass produce, and relatively expensive to make in small quantities.

Mu Metal and Wall Structure

When the vacuum chamber is used to house a charged particle lithography machine, the chamber preferably includes one or more shielding layers to provide isolation from magnetic fields external to the chamber. Such magnetic fields may influence the electron beams and interfere with correct operation of the lithography system. One or more mu metal layers may be included on the inside or outside surface of the wall panels, and strip members or frame members if used. The mu metal layers may also be sandwiched within the wall/strip member construction between layers of other material when a multi-layer composite construction is used. In this way the shielding in the chamber walls can be continued uninterrupted through the entire structure resulting in a kit-set style vacuum chamber with the shielding entirely incorporated (and continuous) in the structure of the vacuum chamber. Parts protruding the chamber, such as leg or supports of the lithography machine (wafer stage and charged particle column) and actuator rods for the stage, are preferably also covered by a mu metal layer, e.g. a bellows construction of mu metal.

Figure 22A:
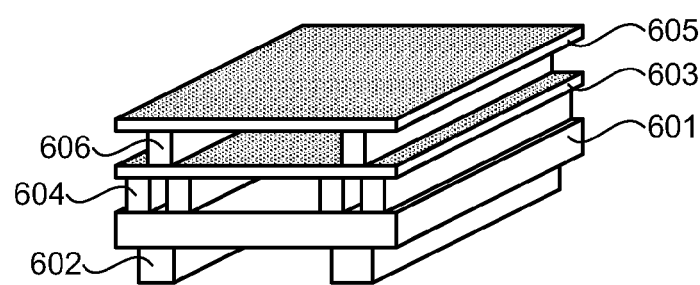
FIGS. 22A and 22B are perspective views of a section of a wall panel having a composite structure.

FIG. 22A shows an embodiment of a wall panel for a vacuum chamber with two layers of mu metal. A section of the chamber wall 601 is shown with (optional) reinforcing beams 602 on the outside surface of the wall, for example reinforcing beams 545 in FIG. 13. A first mu metal layer 603 has spacing members 604 in the form of ribs between the mu metal layer 603 and chamber wall 601, to create a space between them. A second mu metal layer 605 has spacing members 606 between the two mu metal layers, to create a space between them. The mu metal layers have holes in them to avoid pressure differences in the vacuum chamber when the chamber is evacuated.

Figure 22B:
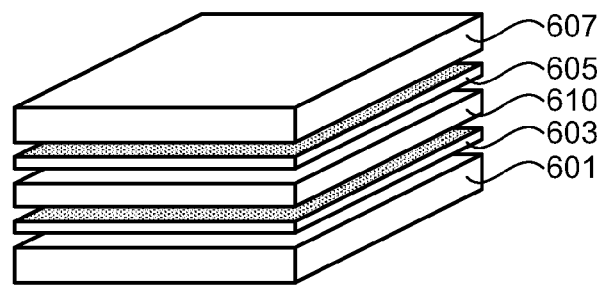

FIG. 22B shows an exploded view of an alternative embodiment of a wall panel with an open layer 610 separating the two layers of mu metal 603 and 605, where the layer 610 preferably has an open structure such as a honeycomb. The layers are shown separated in the drawing for clarity, but the layers would be formed into a single composite wall in practice. The layer 610 provides a light-weight but rigid wall separating the two mu metal layers to create a sandwich construction, so that the spacing members 604 and 606 in the embodiment of FIG. 22A can be dispensed with. This construction may also enable reinforcing beams to be eliminated. Layers 601 and 607 are metal layers, preferably aluminum. Layer 610 is preferably an aluminum honeycomb layer. The resulting composite wall structure provides a wall panel that is easy and cheap to manufacture, can be prefabricated, and is lightweight and rigid, with the honeycomb layer providing the required strength and the mu metal layers providing protection from external electromagnetic fields.

The mu metal layers are preferably separated by an insulating layer, such as a composite layer of carbon fiber and/or glass reinforced plastic. One embodiment of the composite wall comprises a sandwich construction comprising a first insulating layer, an aluminum honeycomb layer, a mu metal layer, a second insulating layer, and a solid aluminum layer. Additional sets of mu metal layers and insulating layers may be added to increase the magnetic field shielding of the chamber wall. The solid aluminum layer is preferably on the vacuum side. The honeycomb aluminum provides the strength of the sandwich. The thickness of the honeycomb layer may be increased, or additional honeycomb layers used to increase the stiffness of the wall. The layers are preferably glued together. When the open layer 610 is made from an insulating material, this can itself provide an insulating layer to separate the mu metal layers. A composite wall panel using this construction provides a light weight and rigid wall that can be prefabricated, and designed with the required level of magnetic shielding. This structure incorporates the mu metal shielding into the wall of the vacuum chamber, and avoids using thick solid metal layers to obtain the required strength. Note that any of the composite walls described above may be used in any of the embodiment of the vacuum chamber described herein.

Figure 22C:
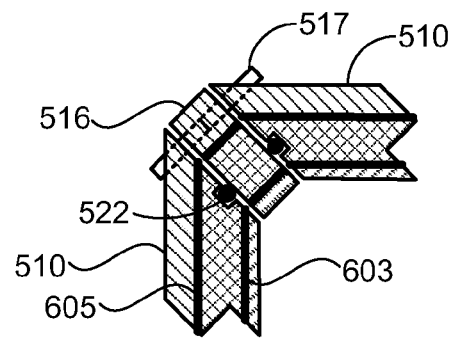
FIG. 22C is a cross section view of a connection between two wall panels having a composite structure.

FIG. 22C shows an example of a wall panel joint for a composite wall panel, similar to the construction shown in FIG. 8B. The edges of the walls 510 are angled and a strip member 516 is positioned between the edges of the walls and located by connection members 517. Sealing members such as O-rings or C-rings 522 may be used to seal the joints between the walls 510 and the strip 516. The walls and strip member each have a composite sandwich construction, in this embodiment comprising outer metal layers, and center honeycomb layer, and mu metal layers 603 and 605 arranged to form two essentially continuous shielding layers from one wall panel to the other. Using this construction, the shielding provided by the mu metal layers is continuous, even at the edge connections of the wall panels.

Figure 23A:
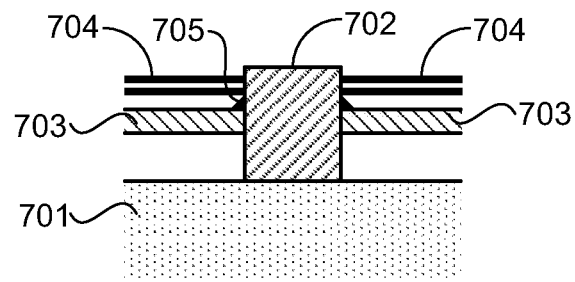
FIGS. 23A-23C are cross section views through a bottom wall of a vacuum chamber showing various embodiments of an interface with a frame supporting member.

FIG. 23A shows a cross section through the bottom wall (floor) of the vacuum chamber 400 where it interfaces with the frame supporting the lithography machine housed in the chamber. Frame member 702 is shown extending through the chamber wall and resting on base plate 701. Chamber walls 703 abut the frame member 702 and may be welded to the frame member (weld 705). Two mu metal layers 704 also abut the frame member 702 to avoid gaps which can permit external magnetic fields to enter the chamber.

Figure 23B:
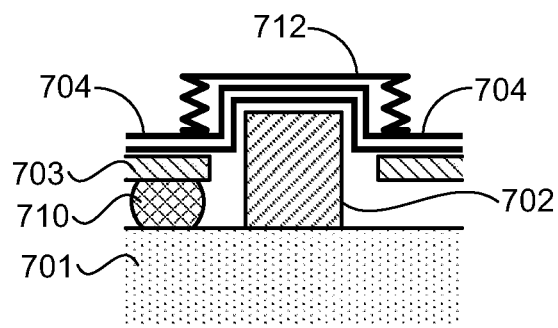
Figure 23C:
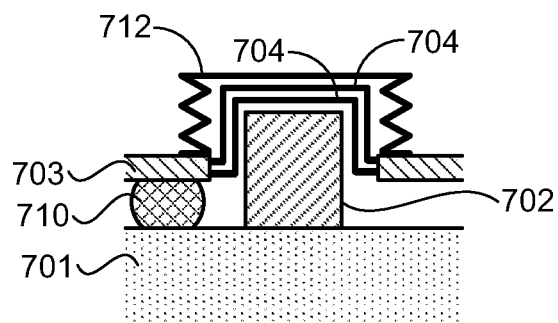

In order to reduce acoustic and vibrational coupling between the base plate 701 and the vacuum chamber 400 which can affect the stability of the lithography machine, alternative embodiments are shown in FIGS. 23B and 23C. In these embodiments, the chamber walls 703 are not rigidly fixed to frame member 702, and have a small gap between the walls and the frame member. The walls are supported in part by a vibration damping element 710 such as an air mount. The mu metal layers 704 extend over, or, alternatively, underneath, the frame member 702 to eliminate any gaps in the shield. A bellows section 712 may also be provided, extending over the frame member 702, to provide additional support to the chamber wall and providing additional sealing around the frame member while permitting some flexing to reduce mechanical coupling between the base plate and the chamber walls. In the embodiment of FIG. 23B, the bellows section 712 is coupled to the mu metal layers 704. In the embodiment of FIG. 23C, the bellows section 712 is coupled to the chamber walls 703 instead. Additionally, the mu metal layers 704 are coupled to the chamber walls 703 e.g. by clamping.

Ports

A lithography machine requires a large number of electrical and optical signals to operate, which must exit the vacuum chamber for connection to power and control systems which are typically located outside the chamber. The vacuum housing includes openings, referred to herein as ports, for admitting cables carrying the signals from these systems into the vacuum housing (openings are also required to permit the vacuum pumps to pump down the chamber). The ports are designed to make a vacuum seal around the cables. The lithography system preferably has a modular construction so that various critical subsystems can be removed from the system and replaced without disturbing other subsystems. To facilitate this design, each such modular subsystem preferably has its collection of electrical, optical, and/or power cabling connections routed through one or more ports dedicated to that module. This enables the cables for a particular module to be disconnected, removed, and replaced without disturbing cables for any of the other modules. The ports are preferably designed to facilitate the removal and replacement of the cables, connectors, and port lids as a unit, for example an electronic unit. The vacuum chamber also requires openings for one or more vacuum pumps to pump air from the chamber to evacuate the chamber.

In some embodiments, the ports and vacuum pumps are located only on a single wall panel of the vacuum chamber, e.g. the top panel or rear panel. The vacuum pumps, e.g. turbo pumps, are connected to ports arranged in a wall of the chamber. The cabling from the ports is routed to the associated control systems via conduits arranged in a cable rack. In the embodiment shown in FIGS. 17B and 17C, the ports are located on the side walls of the top portion 475 of chamber 400, and the vacuum pumps are located behind (or in front) of the top portion 475.

Figure 24A:
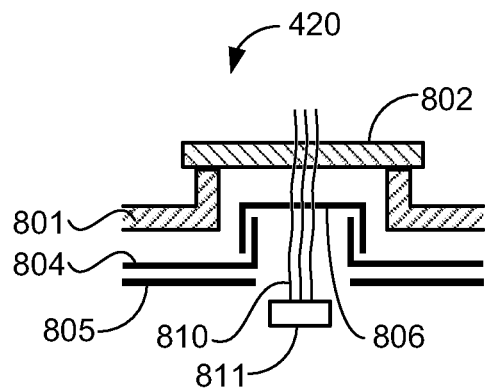
FIGS. 24A-24C are cross section views through a wall of a vacuum chamber showing various embodiments of a port lid and mu shield cap.

FIG. 24A shows a cross section through a wall panel of the vacuum chamber 400, showing a port 420. A portion 801 of the top wall is shown with an opening closed off by lid 802. Two mu metal layers 804 and 805 also have a corresponding opening. The upper mu metal layer 804 has a cap 806 fitting over a lip in the layer 804, providing a complete shielding layer when the cap is in place. Cables 810 enter the vacuum chamber through the port lid 802 and the cap 806, and terminate in connector 811. The opening in the mu metal layers must be sufficiently large for the connector 811 to pass through, so that the assembly of the connector 811, cables 810, cap 806, and lid 802 can be removed and replaced when necessary.

Figure 24B:
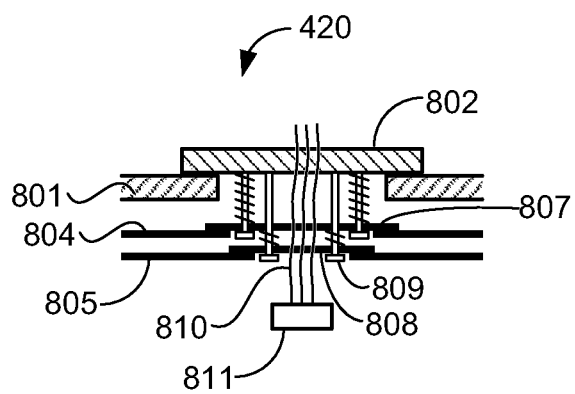

FIG. 24B shows an alternative embodiment of the port 420. Each mu metal layer 804, 805 has a cap 807, 808. The mu metal caps are attached to the lid 802 via bolts or connecting pins 809, with springs or spring-like elements. When the port is closed, the mu metal caps 807 and 808 are pushed against the respective mu metal layers 804 and 805 to produce a positive closure of the caps over the opening in the mu metal layers. This ensures there are no gaps in the mu metal layers when the port is closed. The structure also fixes the mu metal caps 807 and 808 to the port lid 802.

Figure 24C:
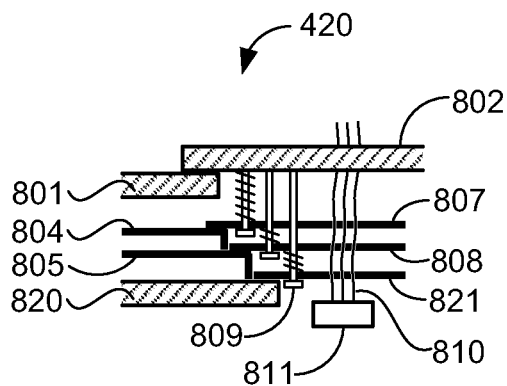

FIG. 24C shows another alternative arrangement for the port 420. Only one side of the port is shown in the drawing for simplicity. In this arrangement, the chamber wall includes a second wall layer 820, and a third mu metal cap 821 is also included. The three mu metal caps are attached to the lid 802 via bolts or connecting pins 809, with springs or spring-like elements, as in the previous embodiment. When the port is closed, the mu metal caps 807 and 808 are pushed against the respective mu metal layers 804 and 805 and the mu metal cap 821 is pushed against wall layer 820. Each mu metal layer 804 and 805 has a lip to further ensure that there are no gaps in the shielding. Alternatively or in addition, the mu metal caps may be provided with lips.

Figure 25A:
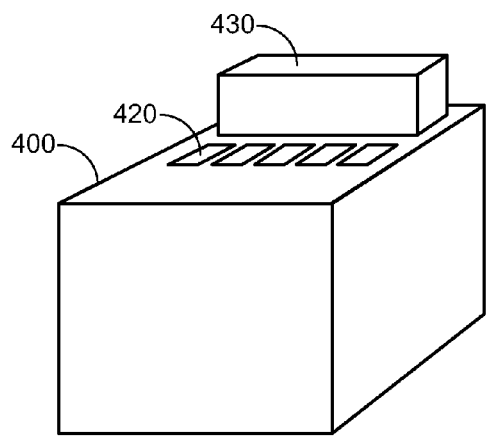
FIG. 25A is a perspective view of an alternative arrangement of ports and vacuum pump openings in a vacuum chamber.
Figure 25B:
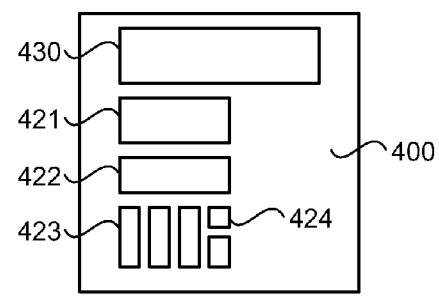
FIG. 25B is a top view of another alternative arrangement of ports and vacuum pump openings in a vacuum chamber.

The ports 420 and vacuum pump openings 431 may be circular, square or rectangular as shown in FIG. 25A. The ports are preferably dedicated to a particular modular subsystem of the machine in the chamber, and may be sized according to the number of cabling connections required for a subsystem. For example, as shown in FIG. 25B, the illumination optics subsystem may require a large port 421, the projection optics subsystem a slightly smaller port 422, and the other subsystems smaller ports 423 and 424.

Vacuum Pumps

A vacuum chamber 400 may have one of more dedicated vacuum pumps 430. Also, one or more vacuum pumps may be shared between several vacuum chambers. Each chamber may have a small vacuum pump, and share a larger vacuum pump. The ability to use more than one pump to realize a vacuum in the vacuum chamber 400 creates a vacuum pump redundancy that may improve the reliability of vacuum operation. If a vacuum pump malfunctions, another vacuum pump can take over its function.

Figure 26:
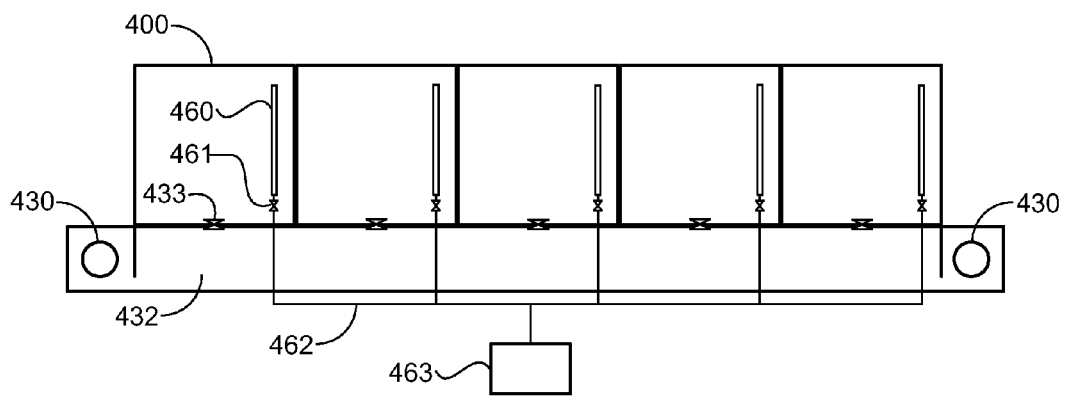
FIG. 26 is a schematic diagram of vacuum chambers sharing turbo vacuum pumps.

FIG. 26 shows an arrangement with five vacuum chambers 400 sharing two turbo vacuum pumps 430. The vacuum pumps are arranged at each end of a shared duct or pipe 432. In an embodiment, the pumps 430 and the duct or pipe 432 serve two rows of chambers 400 from a central position. The number of shared pumps may vary, i.e. one or more. The duct or pipe 432 is connected to each vacuum chamber via a flap or valve 433. The flap or valve 433 preferably is made of mu metal or includes a mu metal layer to provide shielding.

A water vapor cryopump 460, for example in the form of one or more cryopump shields, may additionally be included in each vacuum chamber to capture water vapor in the chamber to assist in forming the vacuum in the chamber. This reduces the size of the vacuum pumps needed to produce an adequate vacuum and reduces pumpdown time, and uses no moving parts so that it does not introduce vibrations typically caused by other types of low temperature (<4K) systems. The water vapor cryopumps 460 are connected via valve 461 and refrigerant supply line 462 to cryopump control system 463.

The vacuum in the vacuum chambers can thus be generated by both the turbo vacuum pumps 430 and the water vapor cryopumps 460 of the cryopump system. Preferably, the turbo pumps 430 are activated first followed by activation of the cryopump system by means of cryopump control system 463 to generate the vacuum. Activation of a turbo vacuum pump 430 prior to a water vapor cryopump 460 may lead to a more efficient vacuum pumping procedure than other control schemes of vacuum pumping activation. To further enhance efficiency, the turbo pump or pumps 430 may be isolated from the vacuum chamber after a certain period of time following its activation. Such a period of time may correspond to a time needed to obtain a pressure value below a certain predetermined threshold value. After isolation of the turbo pump or pumps 430 the water vapor cryopump 460 may continue to operate to complete generation of the vacuum.

The arrangement shown in FIG. 26 may be modified to accommodate multiple layers of stacked vacuum chambers, with vacuum chambers being stacked vertically as well as or in addition to being arranged side-by-side. Two, three, or possibly more layers of vacuum chambers may be used, for example creating an arrangement of 10 chambers (for two layers) or 15 chambers (for three layers) in the arrangement shown in FIG. 26. Multiple chambers may utilize a common vacuum pumping system and a common vacuum pumping system may be utilized for each layer of chambers. In an embodiment, a vacuum in a vacuum chamber belonging to a set of vacuum chambers may be realized by pumping down each chamber separately by the common vacuum pumping system.

The invention has been described by reference to certain embodiments discussed above. It should be noted various constructions and alternatives have been described, which may be used with many of the other constructions and embodiments described herein, as will be clear to those of skill in the art. Furthermore, it will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A vacuum chamber comprising a plurality of wall panels enclosing an interior space,
   wherein the wall panels are assembled to form the chamber using a plurality of connection members, the connection members locating the wall panels in a predetermined arrangement,
   the vacuum chamber further comprising one or more sealing members provided at edges of the wall panels, wherein the wall panels are arranged so that a vacuum tight seal is formed for forming a vacuum in the interior space,
   wherein the one or more sealing members comprise a single flexible piece of sealing material comprising twelve elongated portions adapted for sealing a gap at twelve edges of the wall panels, and
   wherein the connection members are adapted to locate the wall panels while providing for a small predetermined range of movement of the wall panels.

2. The vacuum chamber of claim 1, wherein the connection members are adapted to removably connect the wall panels and also enable disassembly.

3. The vacuum chamber of claim 1, wherein the connection members are adapted to locate the wall panels while permitting the wall panels to move and seal more tightly against the sealing members when the vacuum is formed in the interior space.

4. The vacuum chamber of claim 1, wherein the connection members are adapted to locate the wall panels without providing the vacuum tight seal at the edges of the wall panels.

5. The vacuum chamber of claim 1, wherein the connection members are adapted to guide the wall panels towards a position providing the vacuum tight seal at the edges of the wall panels.

6. The vacuum chamber of claim 1, wherein the connection members are adapted to locate the wall panels in a position providing a near vacuum tight seal at the edges of the wall panels.

7. The vacuum chamber of claim 6, wherein the vacuum tight seal at the edges of the wall panels is realized by operation of a suction device connected to the interior space, the suction device having an air displacement capacity sufficiently larger than a flow rate of air into the interior space via the near vacuum tight seal to generate the vacuum in the interior space.

8. The vacuum chamber of claim 1, wherein adjacent ones of the wall panels are removably attached to each other using the connection members.

9. The vacuum chamber of claim 1, wherein one or more of the wall panels comprise interlocking regions for interlocking with one or more of the other wall panels, for inhibiting movement of the wall panels under the influence of the vacuum formed in the interior space.

10. The vacuum chamber of claim 1, wherein a vacuum tight seal is formed between the wall panels by a force exerted on the wall panels when the vacuum is formed in the interior space of the chamber.

11. The vacuum chamber of claim 1, further comprising a frame having frame members, wherein the one or more sealing members comprise a sealing member between the wall panels and the frame members, and wherein the wall panels are arranged so that the wall panels are pushed more tightly against the sealing member when a vacuum is formed in the interior space of the vacuum chamber.

12. The vacuum chamber of claim 1, further comprising a strip member between the wall panels, and wherein the wall panels are arranged so that the wall panels are pushed more tightly against the strip member when a vacuum is formed in the interior space of the vacuum chamber.

13. The vacuum chamber of claim 12, wherein one or more of the wall panels have stepped edges.

14. The vacuum chamber of claim 1, wherein at least two of the wall panels have stepped edges forming an interlocking arrangement in which a force exerted against an outside surface of a first one of the two wall panels results in the first wall panel sealing more tightly against the stepped edge of a second one of the two wall panels, and a force exerted against an outside surface of the second wall panel results in the second wall panel sealing more tightly against the stepped edge of the first wall panel.

15. The vacuum chamber of claim 14, wherein an adhesive is applied between opposing stepped edges of the wall panels.

16. The vacuum chamber of claim 1, wherein the connection members penetrate only a portion of a thickness of the wall panels.

17. The vacuum chamber of claim 1, wherein the connection members comprise pins or bolts.

18. The vacuum chamber of claim 1, comprising a strip member interposed between beveled edges of two of the wall panels, the beveled edge of each wall panel forming a seal against a surface of the strip member opposing the wall panel.

19. The vacuum chamber of claim 18, further comprising an O-ring disposed between the beveled edge of each wall panel and the opposing surface of the strip member.

20. The vacuum chamber of claim 18, further comprising a connection member for connecting the wall panels and the strip member.

21. The vacuum chamber of claim 18, further comprising an adhesive between the beveled edge of each wall panel and the opposing surface of the strip member.

22. The vacuum chamber of claim 1, further comprising a frame, wherein the wall panels are attached to the frame using the connection members.

23. The vacuum chamber of claim 22, wherein the one or more sealing members are provided between the wall panels and the frame for forming the vacuum tight seal between the wall panels and the frame.

24. The vacuum chamber of claim 22, wherein the frame comprises interlocking regions for interlocking with one or more of the wall panels, for inhibiting movement of the wall panels or frame under the influence of the vacuum formed in the interior space.

25. The vacuum chamber of claim 23, wherein the frame comprises interlocking regions for interlocking with one or more of the wall panels, for inhibiting movement of the wall panels or frame under the influence of the vacuum formed in the interior space.

26. The vacuum chamber of claim 23, wherein the frame comprises frame members, and wherein the wall panels and frame are arranged so that, when a vacuum is formed in the interior space, the wall panels and the frame members are interlocked more tightly.

27. The vacuum chamber of claim 23, wherein the frame comprises a plurality of interconnected frame members, the frame members connected by connecting members.

28. The vacuum chamber of claim 27, wherein one or more of the frame members comprise one or more recesses in an end region for interlocking with an end region of another frame member.

29. The vacuum chamber of claim 27, wherein at least one of the frame members has a cross-sectional profile with a cut-out portion for accommodating an edge of one of the wall panels.

30. The vacuum chamber of claim 27, wherein at least one of the frame members has a cross-sectional profile with two cut-out portions, a first cut-out portion for accommodating an edge of a first one of the wall panels and a second cut-out portion for accommodating an edge of a second one of the wall panels.

31. The vacuum chamber of claim 30, wherein the at least one frame member forms an interlocking arrangement with the first and second wall panels in which a force exerted against an outside surface of the first wall panel results in the first wall panel sealing more tightly against the first cut-out portion of the frame member and the second cut-out portion of the frame member pushing against an end of the second wall panel.

32. The vacuum chamber of claim 27, wherein at least one frame member comprises two cut-out portions, and wherein the frame members and the wall panels form an interlocking arrangement in which a lower pressure in the vacuum chamber results in a first force exerted against an outside surface of a first one of the wall panels acting in a direction to push the first wall panel more tightly against a first one of the cut-out portions of the at least one frame member, and a second force exerted against an outside surface of a second one of the wall panels acting in a direction to push the second wall panel more tightly against a second one of the cut-out portions of the at least one frame member.

33. The vacuum chamber of claim 27, wherein one or more of the frame members comprise recesses or holes for receiving fastening members for connection of additional frame members.

34. The vacuum chamber of claim 33, wherein the recesses or holes in the frame members are pre-drilled and plugged before assembly of the vacuum chamber.

35. The vacuum chamber of claim 34, wherein the recesses or holes in the frame members are plugged with a bolt or pin extending into the recess or hole from within the chamber.

36. The vacuum chamber of claim 35, wherein the recesses or holes are pre-drilled in standardized positions along one or more of the frame members.

37. The vacuum chamber of claim 22, wherein the frame comprises a plurality of interconnected frame members and a plurality of corner components at corners of the frame, the corner components connecting the frame members.

38. The vacuum chamber of claim 1, wherein the sealing members are sandwiched between the wall panels.

39. The vacuum chamber of claim 1, wherein the twelve elongated portions form eight corners.

40. The vacuum chamber of claim 1, wherein the single flexible piece of sealing material consists of the twelve elongated portions and eight corners, each corner formed by an intersection of three of the elongated portions.

41. A kit set of components for assembly into a vacuum chamber, the kit set comprising a plurality of wall panels, a plurality of connection members adapted for removably attaching to the wall panels to locate the wall panels in a predetermined arrangement enclosing an interior space, and one or more sealing members adapted for forming a vacuum tight seal at edges of the wall panels, wherein the one or more sealing members comprise a single flexible piece of sealing material comprising twelve elongated portions adapted for sealing a gap at twelve edges of the wall panels, and
    wherein the connection members are adapted to locate the wall panels while providing for a small predetermined range of movement of the wall panels when the kit set is assembled.

42. The kit set of claim 41, wherein the connection members are adapted to locate the wall panels when the kit set is assembled while permitting the wall panels to move and seal more tightly against the sealing members when a vacuum is formed.

43. The kit set of claim 41, wherein the connection members are adapted to guide the wall panels towards a position providing a vacuum tight seal at the edges of the wall panels when the kit set is assembled.

44. The kit set of claim 41, wherein the connection members are adapted to locate the wall panels in a position providing a near vacuum tight seal at the edges of the wall panels when the kit set is assembled.

45. The kit set of claim 41, wherein the wall panels are adapted to sandwich the sealing members.

46. The kit set of claim 41, wherein the twelve elongated portions form eight corners.

47. The kit set of claim 41, wherein the single flexible piece of sealing material consists of the twelve elongated portions and eight corners, each corner formed by an intersection of three of the elongated portions.

48. A vacuum chamber comprising a plurality of wall panels enclosing an interior space,
    wherein the wall panels are assembled to form the chamber using a plurality of connection members, the connection members locating the wall panels in a predetermined arrangement,
    the vacuum chamber further comprising one or more sealing members provided at the edges of the wall panels, wherein the wall panels are arranged so that a vacuum tight seal is formed for forming a vacuum in the interior space,
    wherein the one or more sealing members comprise a single flexible piece of sealing material comprising an O-ring or C-ring formed in a three dimensional substantially cubic form, and
    wherein the connection members are adapted to locate the wall panels while providing for a small predetermined range of movement of the wall panels.

49. The vacuum chamber of claim 48, wherein the sealing members are sandwiched between the wall panels.

50. The vacuum chamber of claim 48, wherein twelve elongated portions form eight corners.

51. The vacuum chamber of claim 48, wherein the single flexible piece of sealing material consists of twelve elongated portions and eight corners, each corner formed by an intersection of three of the elongated portions.

* * * * *